(12) United States Patent
Park et al.

(10) Patent No.: US 10,923,688 B2
(45) Date of Patent: Feb. 16, 2021

(54) QUANTUM-DOT LIGHT-EMITTING DIODE AND METHOD FOR PRODUCING QUANTUM-DOT LIGHT-EMITTING DIODE

(71) Applicant: UNIST (ULSAN NATIONAL INSTITUTE OF SCIENCE AND TECHNOLOGY), Ulsan (KR)

(72) Inventors: Jong Nam Park, Ulsan (KR); Yo Han Suh, Ulsan (KR); Tae Yun Kim, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 140 days.

(21) Appl. No.: 16/464,389

(22) PCT Filed: Jan. 12, 2017

(86) PCT No.: PCT/KR2017/000417
§ 371 (c)(1),
(2) Date: May 28, 2019

(87) PCT Pub. No.: WO2018/101536
PCT Pub. Date: Jun. 7, 2018

(65) Prior Publication Data
US 2020/0343489 A1 Oct. 29, 2020

(30) Foreign Application Priority Data
Nov. 29, 2016 (KR) ........................ 10-2016-0159940

(51) Int. Cl.
*H01L 51/56* (2006.01)
*C09K 11/06* (2006.01)
(Continued)

(52) U.S. Cl.
CPC .............. *H01L 51/56* (2013.01); *C09K 11/06* (2013.01); *H01L 51/0077* (2013.01);
(Continued)

(58) Field of Classification Search
CPC . H01L 51/56; H01L 51/0077; H01L 51/0039; H01L 51/0043; H01L 51/0059; C09K 11/06
See application file for complete search history.

(56) References Cited

U.S. PATENT DOCUMENTS 9,324,562 B1    4/2016  Luther et al.
2016/0248028 A1* 8/2016 Huang ................ H01L 51/4213

FOREIGN PATENT DOCUMENTS

KR      10-1447238        10/2014
KR      10-2016-0055090    5/2016
(Continued)

OTHER PUBLICATIONS

Hee Chang Yoon et al., "Study of Perovskite QD Down-Converted LEDs and Six-Color White LEDs for Future Displays with Excellent Color Performance", ACS Appl. Mater. Interfaces, 2016, vol. 8, pp. 18189-18200.
(Continued)

*Primary Examiner* — Anthony Ho
(74) *Attorney, Agent, or Firm* — Lex IP Meister, PLLC

(57) ABSTRACT

There are provided a quantum dot light emitting diode based on a quantum dot of which a surface is passivated with a short chain ligand, and a method of manufacturing the same.

19 Claims, 17 Drawing Sheets

(51) Int. Cl.
*H01L 51/00* (2006.01)
*H01L 51/50* (2006.01)

(52) U.S. Cl.
CPC ........ *H01L 51/502* (2013.01); *H01L 51/5056* (2013.01); *H01L 51/5072* (2013.01); *C09K 2211/181* (2013.01); *H01L 51/0039* (2013.01); *H01L 51/0043* (2013.01); *H01L 51/0059* (2013.01); *H01L 2251/558* (2013.01)

(56) References Cited

FOREIGN PATENT DOCUMENTS

| | | |
|---|---|---|
| KR | 10-2016-0055093 | 5/2016 |
| WO | 2016-124555 | 8/2016 |

OTHER PUBLICATIONS

Pan, Jun et al, "Highly Efficient Perovskite Quantum Dot Light Emitting Diodes by Surface Engineering", Advanced Materials, vol. 28, Issue 39, pp. 8718-8725, Oct. 19, 2016.
Kim, Tae-Ho, "Colloidal Quantum Dot Light-Emitting Diodes", Polymer Science and Technology, vol. 23, No. 5, p. 504-508, Oct. 2012, English language translation of Conclusion.

* cited by examiner

[Figure 1]
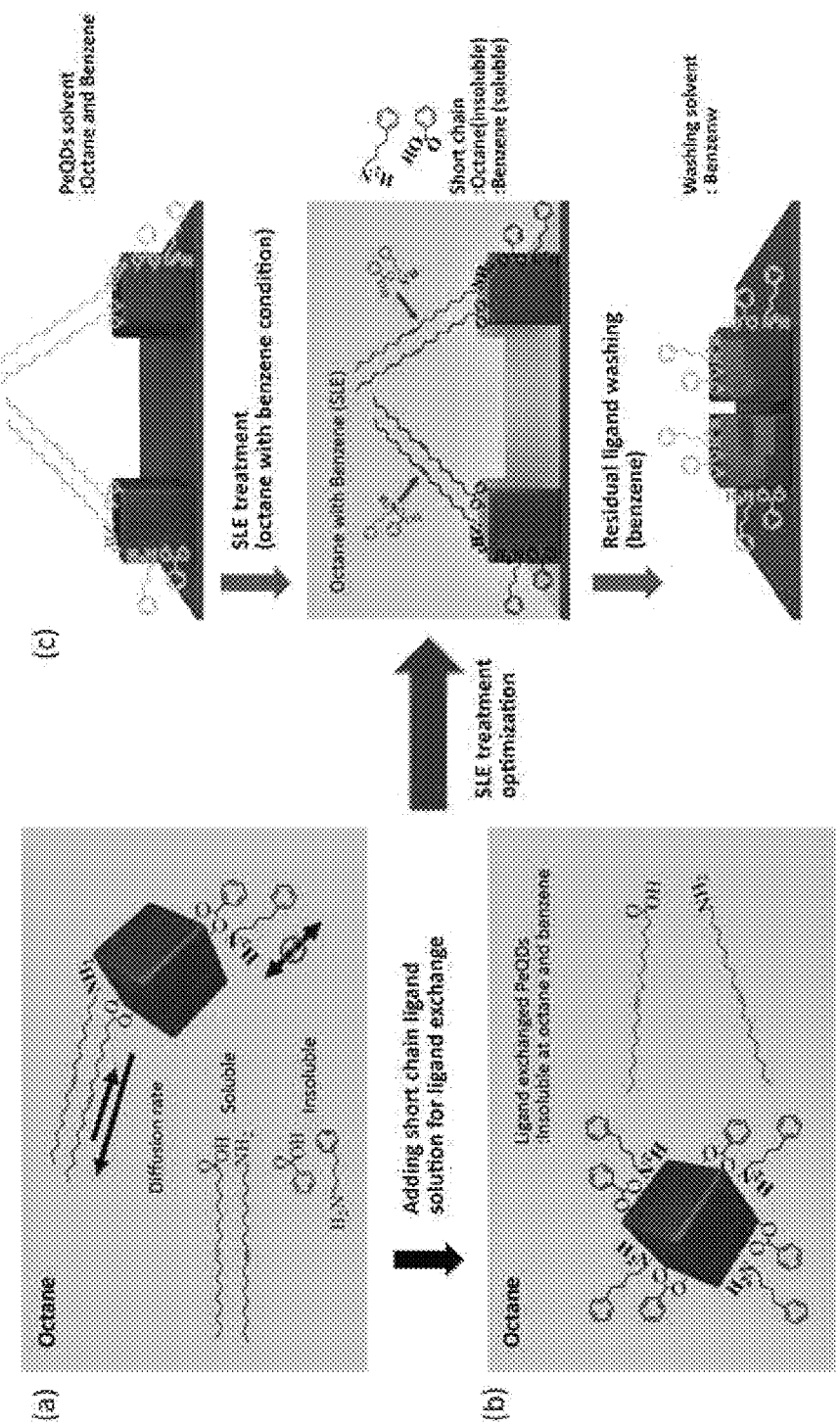

[Figure 2a]
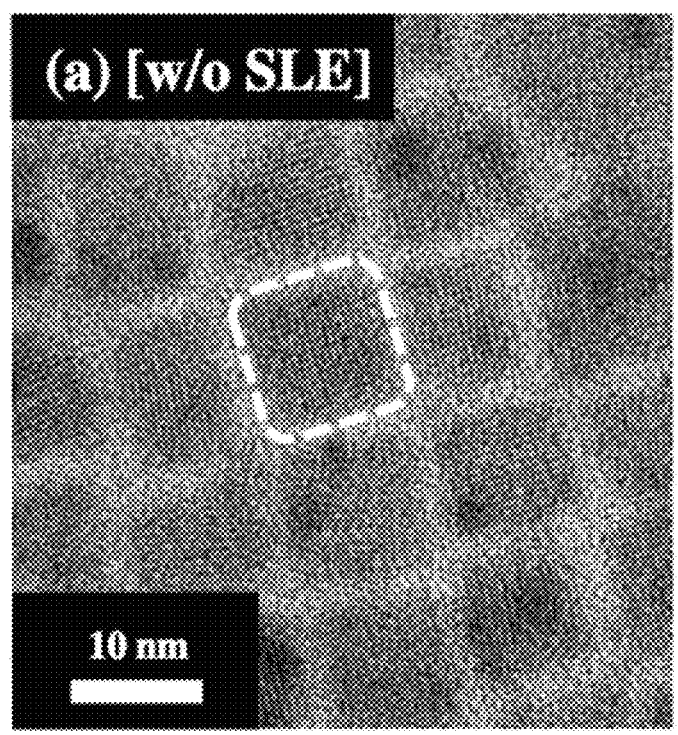

[Figure 2b]
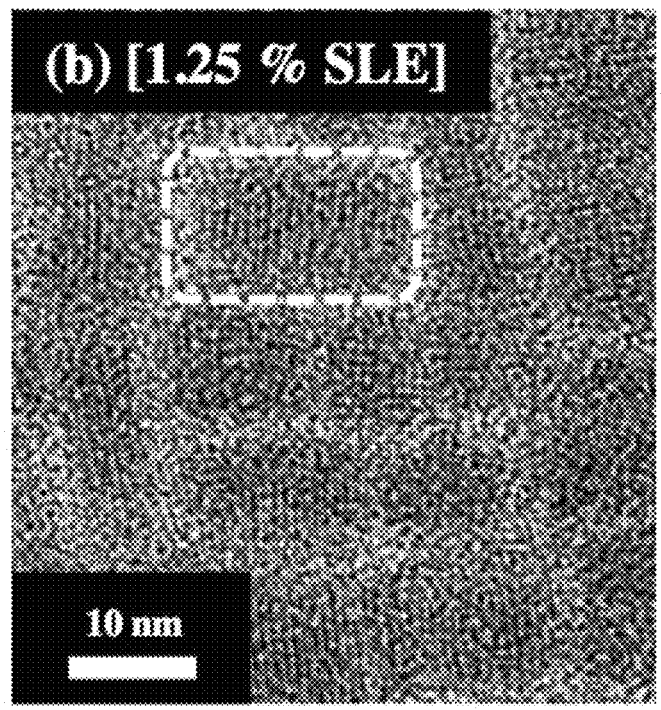

[Figure 2c]
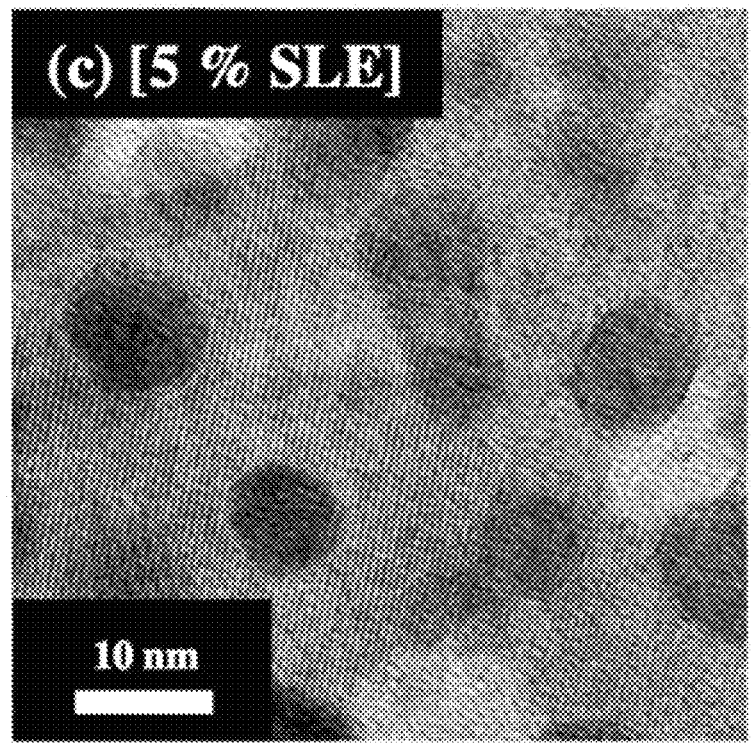
[Figure 2d]
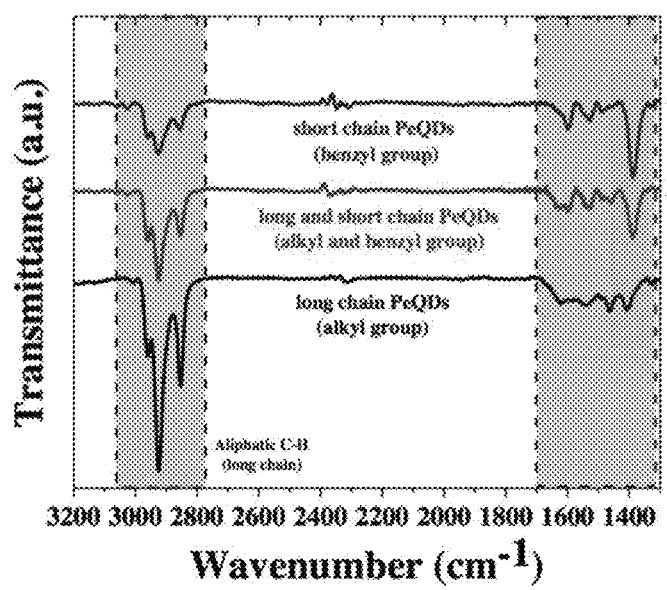

[Figure 2e]
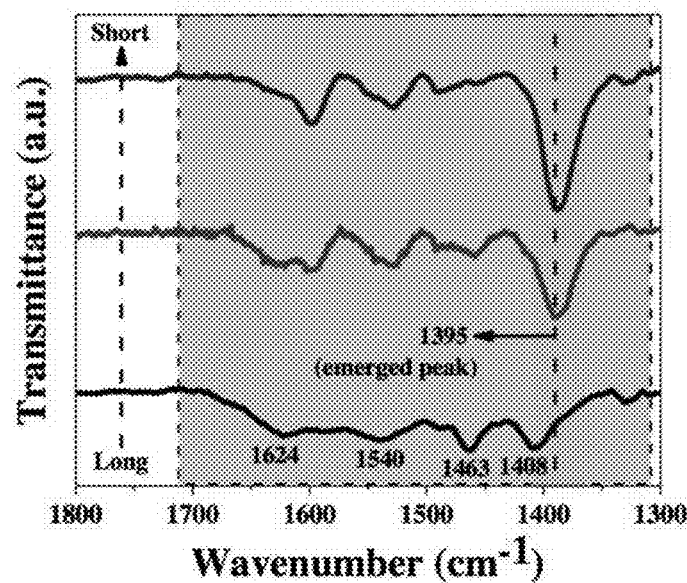
[Figure 3a]
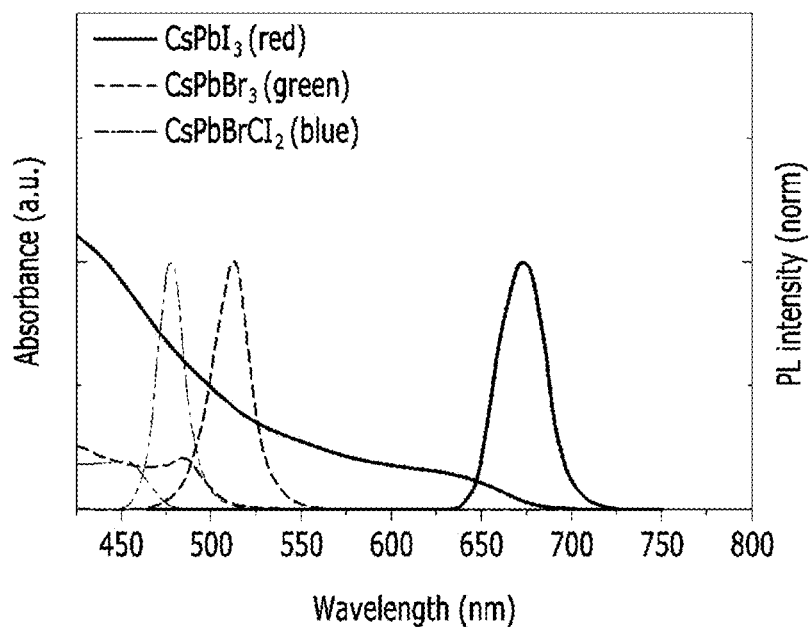

[Figure 3b]
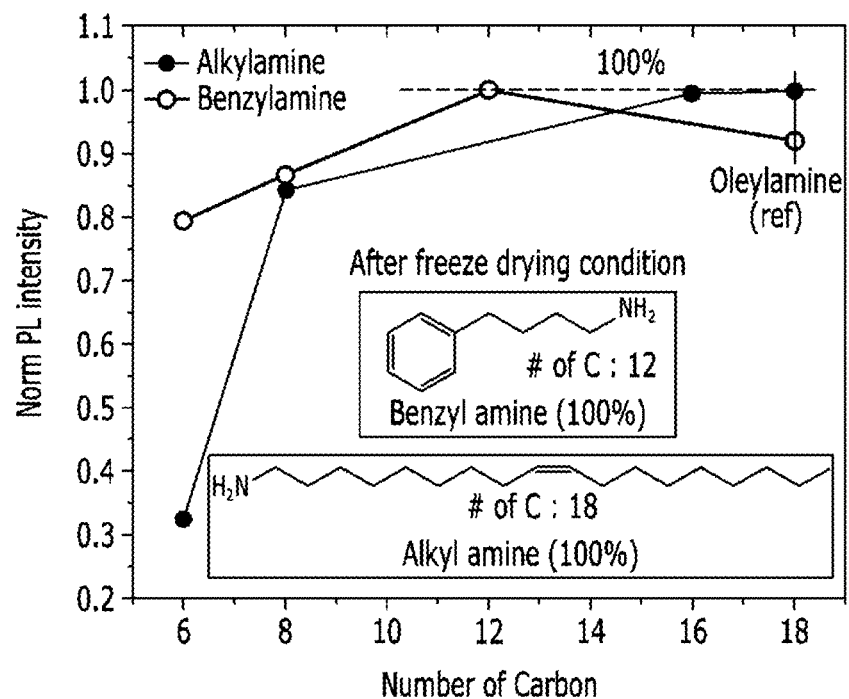
[Figure 3c]
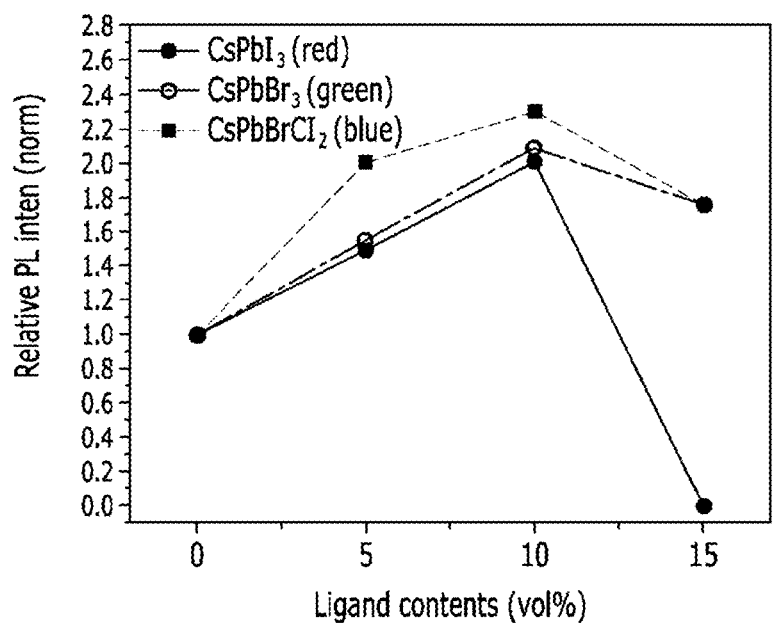

[Figure 3d]
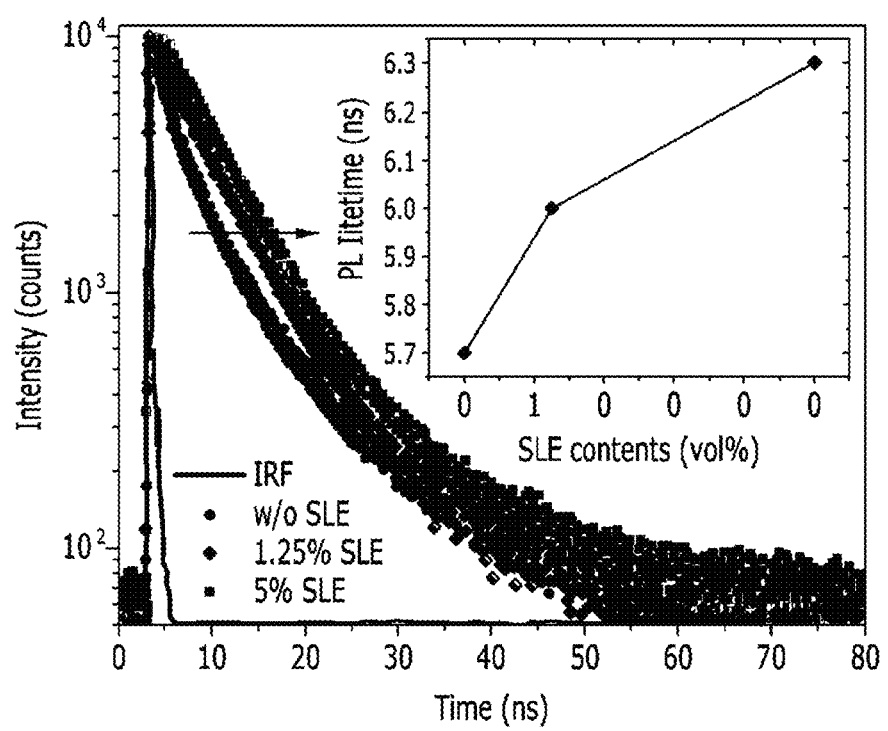

【Figure 4】
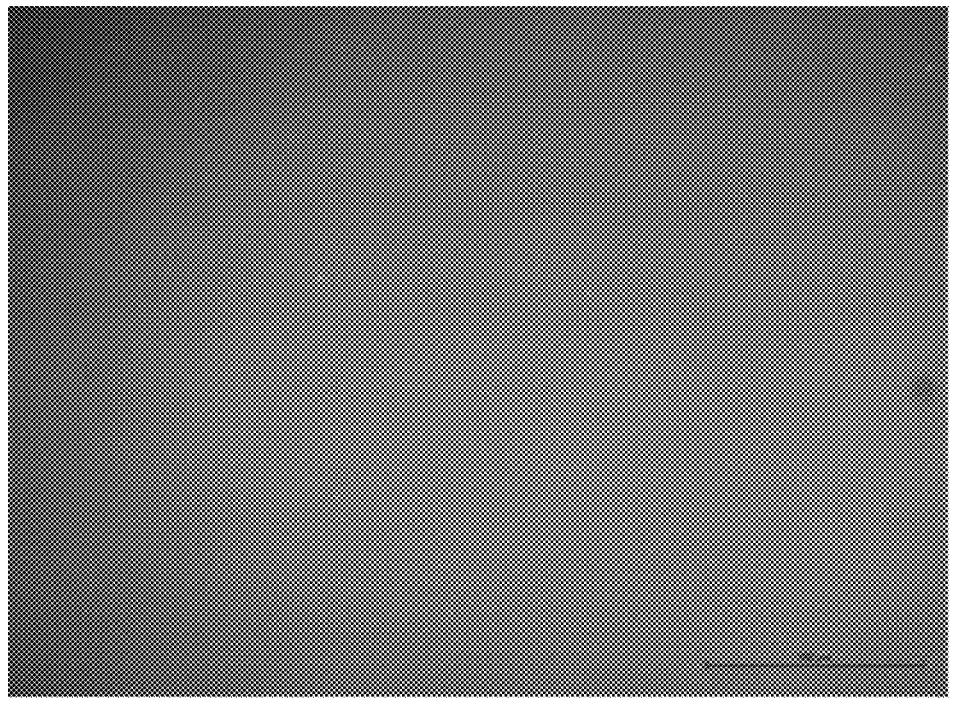

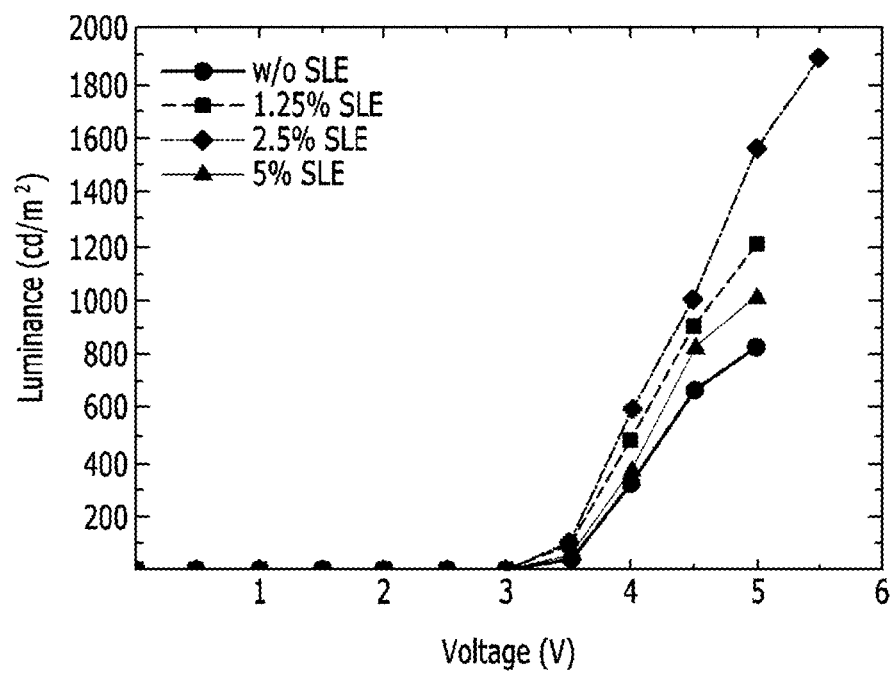
[Figure 5a]

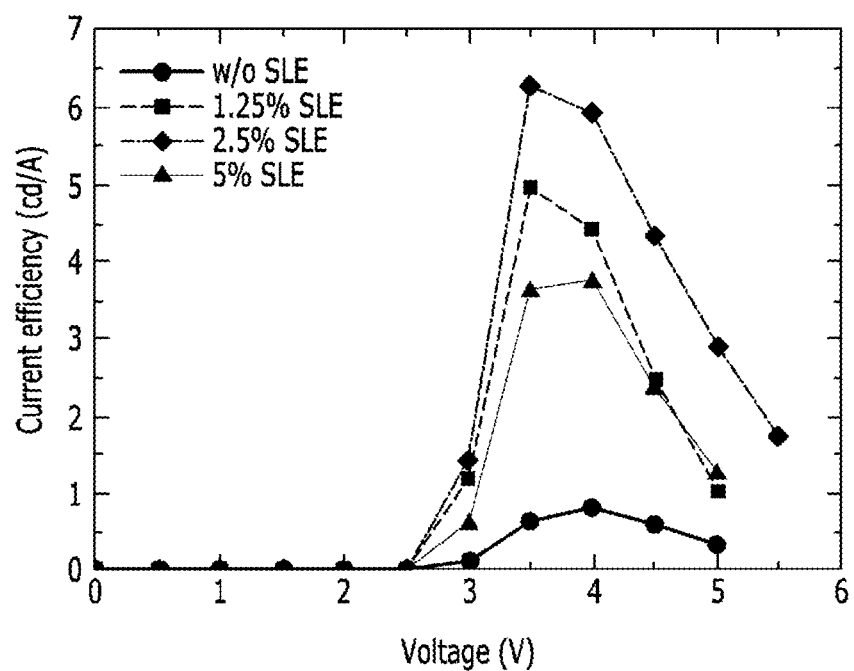
[Figure 5b]

[Figure 5c]
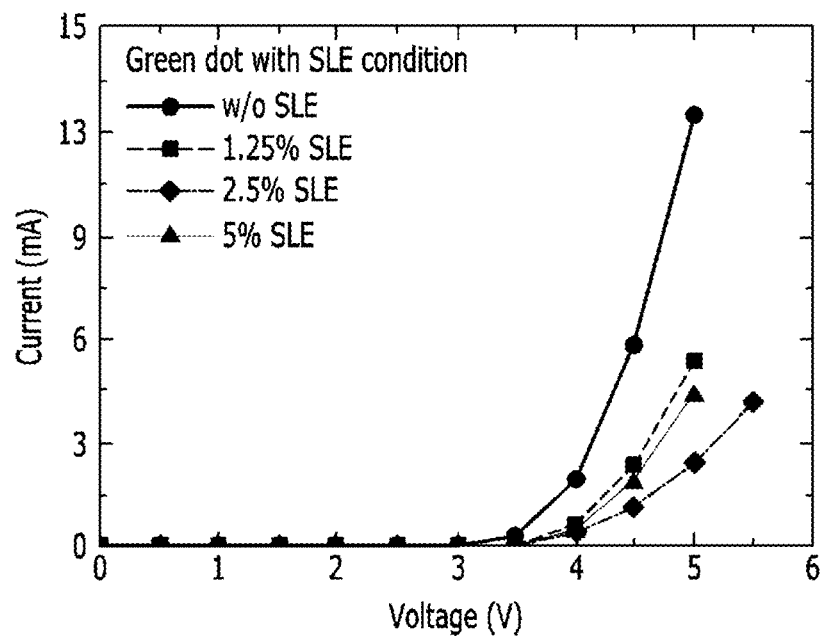
[Figure 5d]
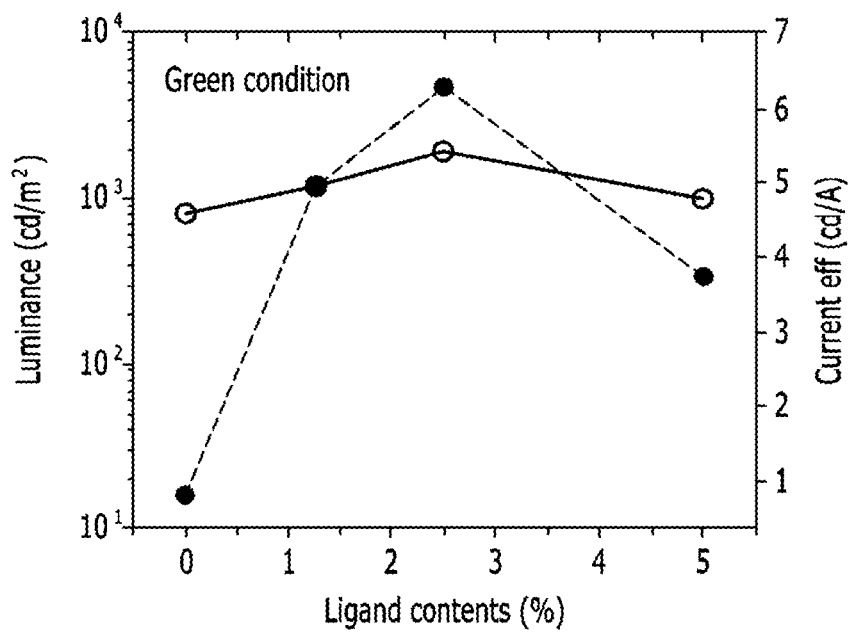

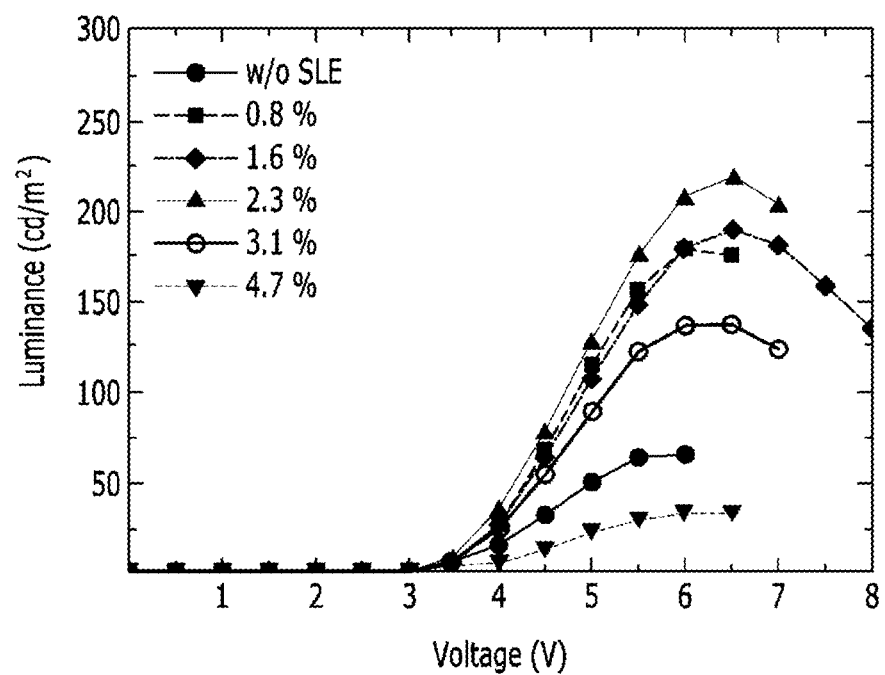
[Figure 6a]

[Figure 6b]
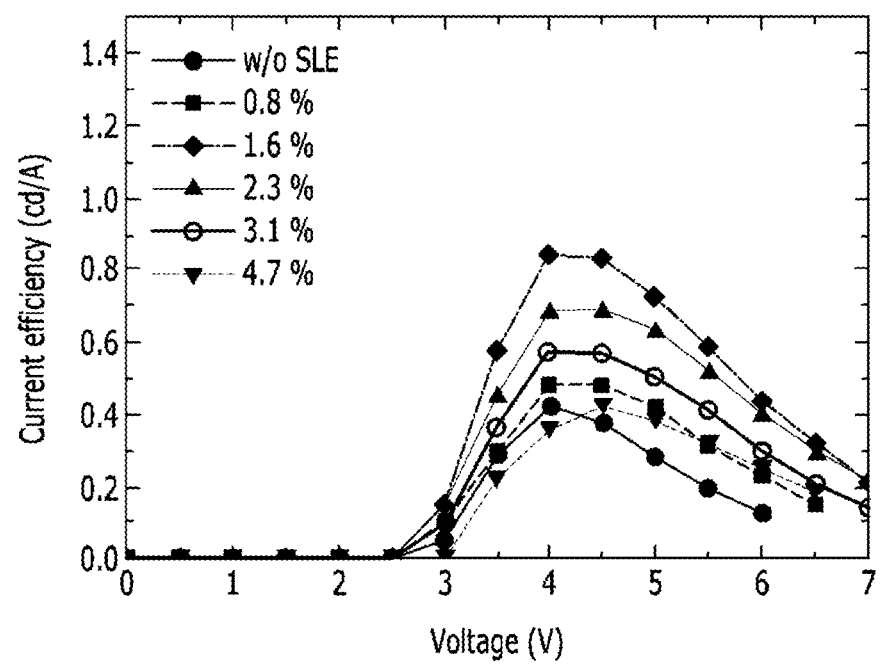

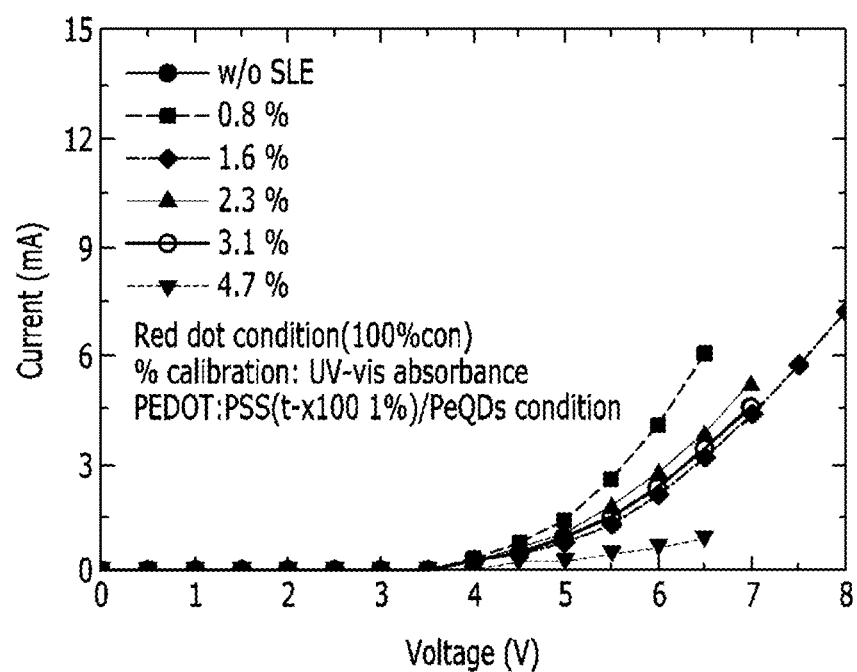
[Figure 6c]

[Figure 6d]
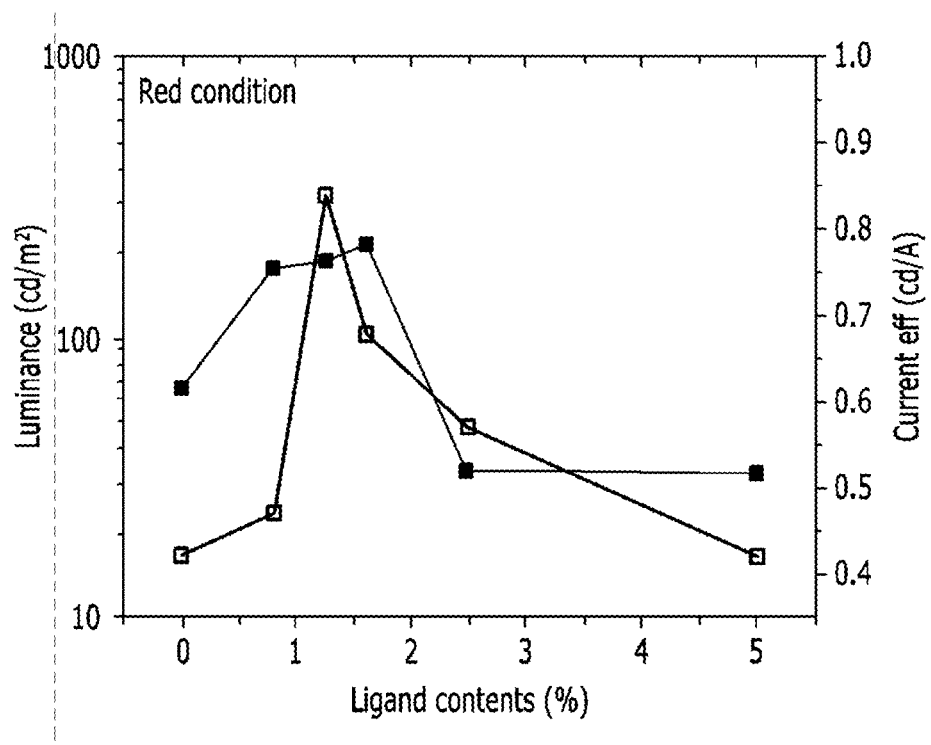

[Figure 7a]
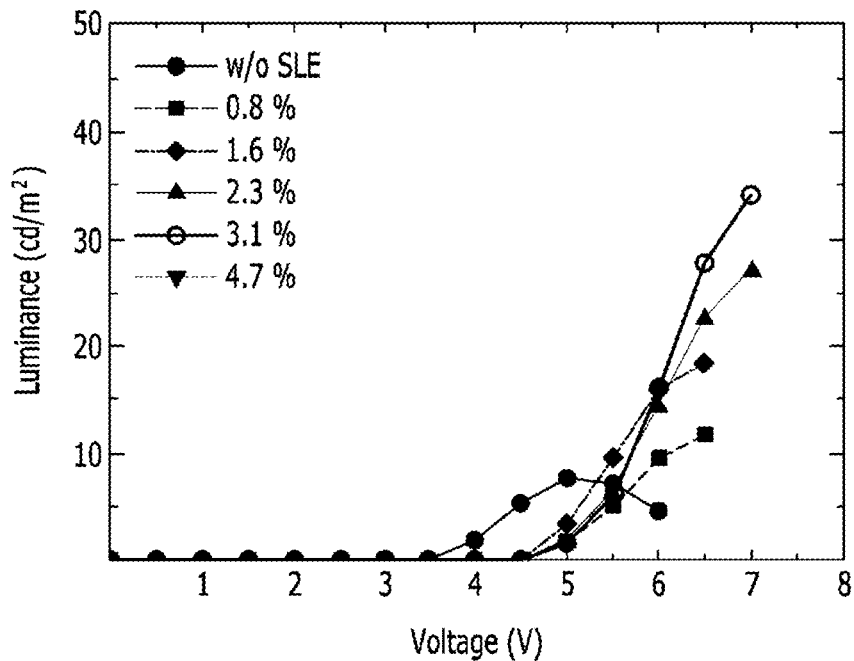
[Figure 7b]
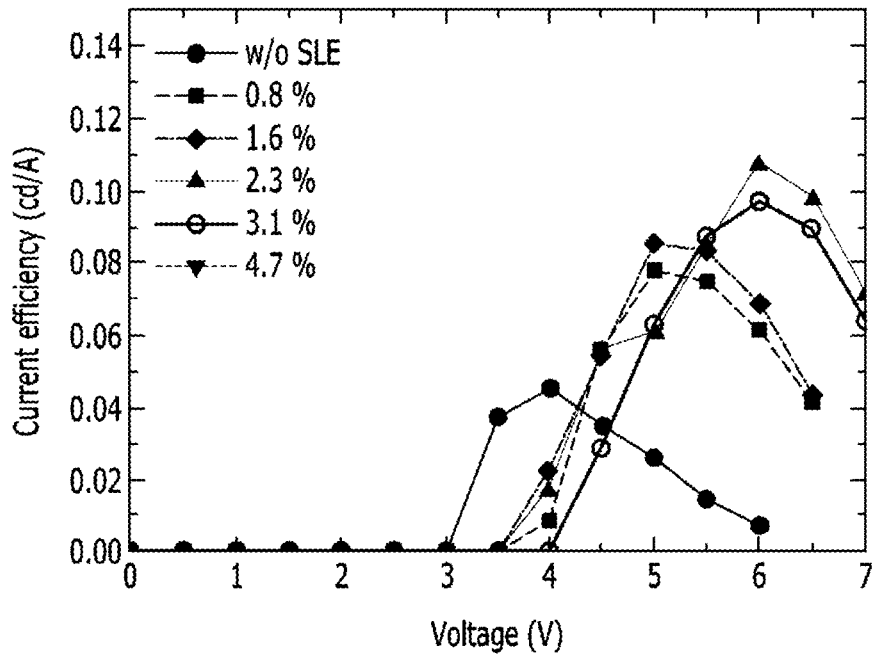

[Figure 7c]
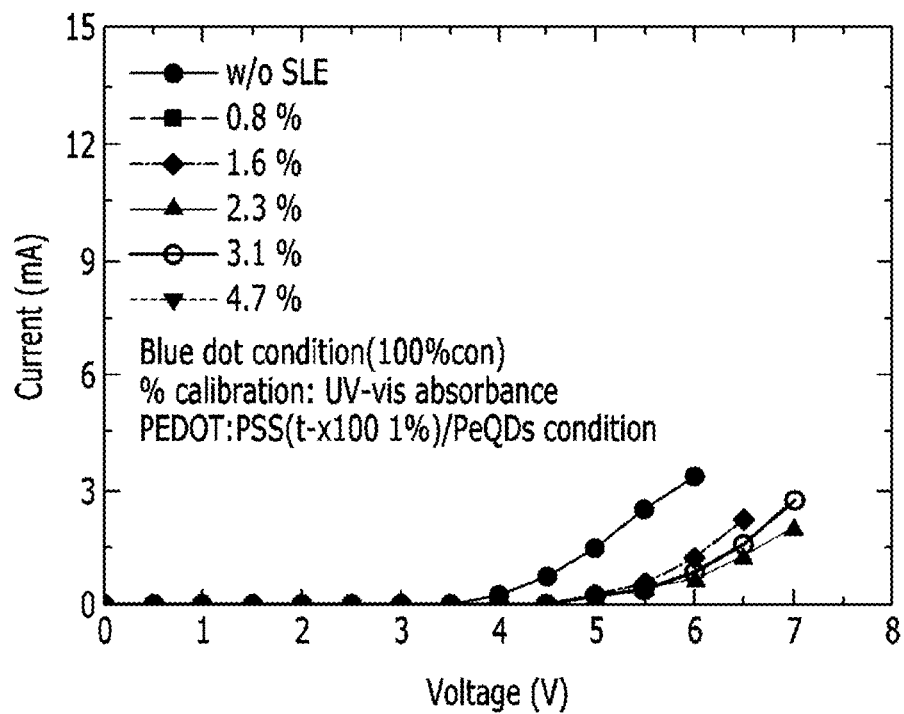
[Figure 7d]
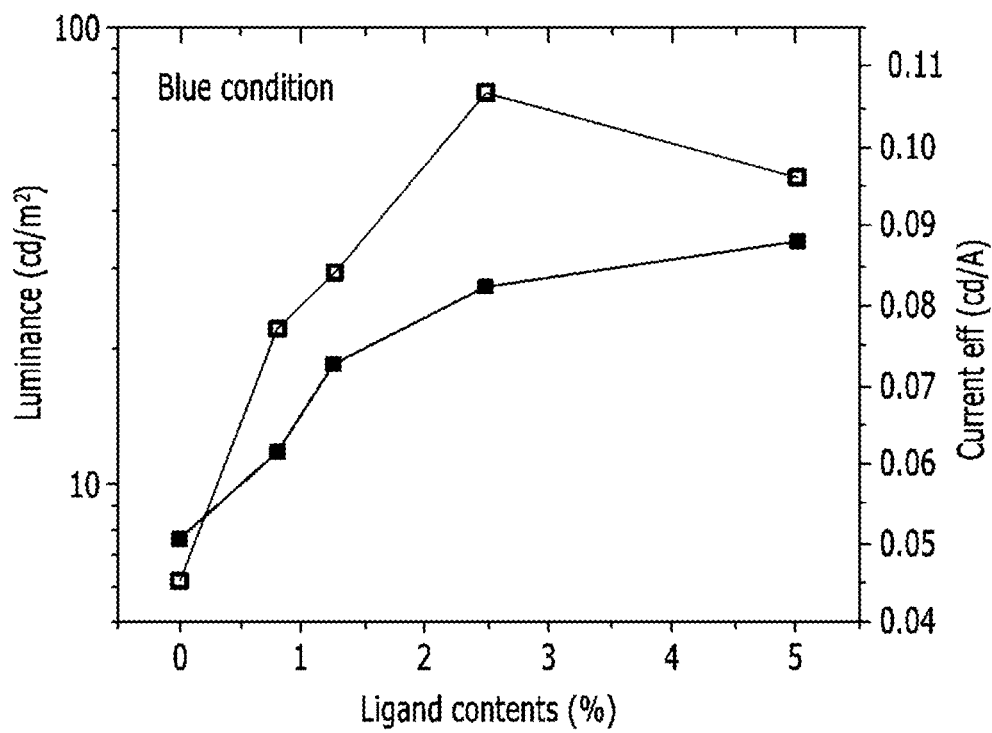

QUANTUM-DOT LIGHT-EMITTING DIODE AND METHOD FOR PRODUCING QUANTUM-DOT LIGHT-EMITTING DIODE

TECHNICAL FIELD

The present invention relates to a quantum dot light emitting diode and a method of manufacturing the same.

BACKGROUND ART

It is known that a material based on a perovskite structure has excellent optoelectronic properties such as being able to realize a narrow half width at half maximum (HWHM) while realizing various band gaps and a high photoluminescent quantum yield (PL-QY).

In this regard, research for applying the perovskite-based material to improve performance of an optoelectronic device such as a solar cell and an organic light emitting device has been continuously conducted.

In detail, an attempt to apply the perovskite-based material to a photo-active layer of an organic light emitting device to implement a perovskite quantum dot light emitting device (PeQLED) has been conducted.

However, there is a limitation in that in the case of applying quantum dots having a perovskite structure (that is, perovskite quantum dots (PeQDs)) to the photo-active layer as a single material, only single colored light is exhibited but it is difficult to exhibit multicolored light and implement a large-area device through a solution process.

DISCLOSURE

Technical Problem

The present invention has been made in an effort to provide a quantum dot light emitting diode having an advantage of being based on a quantum dot having a surface passivated with a short chain ligand, and a method of manufacturing the same.

Technical Solution

An exemplary embodiment of the present invention provides a quantum dot light emitting diode (QLED) having an invert structure including: a cathode including a transparent electrode; an electron transport layer positioned on the cathode; a quantum dot layer positioned on the electron transport layer; a hole transport layer positioned on the quantum dot layer; and an anode positioned on the hole transport layer.

However, the quantum dot layer includes a surface-passivated quantum dot. In detail, the surface-passivated quantum dot may include a perovskite quantum dot (PeQD) including a compound having a perovskite structure represented by the following Chemical Formula 1; and a surface treatment layer positioned on a surface of the quantum dot and including an organic ligand represented by the following Chemical Formula 2 and an organic ligand represented by the following Chemical Formula 3.

$$ABX^1_3 \quad \text{[Chemical Formula 1]}$$

In Chemical Formula 1, A is one of $CH_3NH_2$, $NH_2CH=NH_1-*$, Cs, Rb, Ba, In, K, and Tl, B is one element of Pb, Sn, Bi, Ag, Ge, and Zr, $X^1$ is one element of F, Cl, Br, and I, and a moiety indicated by * in $NH_2CH=NH_1-*$ is bound to B.

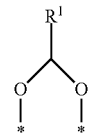

[Chemical Formula 2]

In Chemical Formula 2, $R^1$ is a substituted or unsubstituted (C6-C20) aryl group or substituted or unsubstituted (C1-C6) alkyl group, and moieties indicated by * are each bound to the surface of the quantum dot.

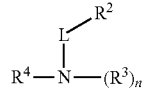

[Chemical Formula 3]

In Chemical Formula 3, L is one of (C1-C5) alkylene groups, $R^2$ to $R^4$ are each one of hydrogen, deuterium, tritium, a substituted or unsubstituted (C1-C6) alkyl group, and a substituted or unsubstituted (C6-C20) aryl group, and n is 0 or 1.

The quantum dot layer may have a total thickness of 1 to 300 nm.

More specifically, the quantum dot layer may include a thin film of 1 to 10 layers in which a thickness of one layer is 1 to 30 nm.

Further, the surface-passivated quantum dot may be uniformly distributed in a front surface of the quantum dot layer.

In detail, the surface-passivated quantum dot may be distributed in a ratio of 80 sq % or more based on 100 sq % of the front surface of the quantum dot layer.

Further, the surface-passivated quantum dot may be distributed in a ratio of 80 to 100 vol % based on a total volume (100 vol %) of the quantum dot layer.

A passivation layer may be formed by a solid-state ligand exchange (SLE) reaction.

In detail, the solid-state ligand exchange reaction may be carried out on a polymer electrolyte layer.

Meanwhile, the quantum dot light emitting diode may further include a polymer electrolyte layer positioned between the electron transport layer and the quantum dot layer.

In this case, the solid-state ligand exchange reaction may be carried out on the polymer electrolyte layer.

The polymer electrolyte layer may be made of one or two or more polymer electrolytes of poly[(9,9-bis(30-(N,N-dimethylamino)propyl)-2,7-fluorene)-alt-2,7-(9,9-dioctylfluorene) (PFN), polyethylene imine (PEI), polyethyleneimine ethoxylated (PEIE).

The electron transport layer may be a thin film containing at least one of metal oxide, bathocuproine (BCP), bathophenanthroline (Bphene), 3-(biphenyl-4-yl)-5-(4-tert-butylphenyl)-4-phenyl-4H-1,2,4-triazole (TAZ), tris(8-hydroxyquinolinato)aluminum (Alq3), 1,3,5-tris(2-N-phenylbenzimidazolyl)benzene (TPBi), and 1,3,5-triazine (T2T).

The electron transport layer may have a thickness of 5 to 200 nm.

The hole transport layer may be a thin film containing at least one of N,N'-di(1-naphthyl)-N,N'-diphenyl-(1,1'-biphenyl)-4,4''-diamine (a-NPD), N,N'-di(1-naphthyl)-N,N'-diphenyl-(1,1'-biphenyl)-4,4"-diamine (NPB), 4,4'-cyclohexylidenebis[N,N-bis(4-methylphenyl)benzenamine] (TAPC), 1,4,5,8,9,11-hexaazatriphenylene hexacarbonitrile (HAT-CN), PEDOT:PSS, 4,4'-bis(N-carbazolyl)-1,1'-biphenyl (CBP), amorphous_4,4'-bis(N-carbazolyl)-1,1'-biphenyl (mCBP), 2,2',7,7'-tetrakis[N,N-di(4-methoxyphenyl)amino]-9,9'-spirobifluorene (Spiro-OMeTAD), and poly(9-vinylcarbazole) (PVK).

The hole transport layer may have a thickness of 5 to 200 nm.

The cathode may include a transparent electrode made of ITO, FTO, an Ag nano-wire, a Cu nano-wire, or a combination thereof.

The anode may be made of Al, Ag, Au, or a combination thereof and have a thickness of 30 to 500 nm.

Another embodiment of the present invention provides a method of manufacturing a quantum dot light emitting diode (QLED) having an invert structure including: preparing a cathode including a transparent electrode; forming an electron transport layer on the cathode; forming a quantum dot layer on the electron transport layer; forming a hole transport layer on the quantum dot layer; and forming an anode on the hole transport layer.

Yet another embodiment of the present invention provides a method of manufacturing a quantum dot light emitting diode (QLED) having an invert structure, the method including: preparing a cathode including a transparent electrode; forming an electron transport layer on the cathode; forming a polymer electrolyte layer on the electron transport layer; forming a quantum dot layer on the polymer electrolyte layer; forming a hole transport layer on the quantum dot layer; and forming an anode on the hole transport layer.

However, the forming of the quantum dot layer on the electron transport layer or the polymer electrolyte layer may include: manufacturing a surface-passivated quantum dot; and applying and coating a solution containing the surface-passivated quantum dot on the electron transport layer or the polymer electrolyte layer.

In detail, the manufacturing of the surface-passivated quantum dot may include mixing a ligand exchange solution containing an organic ligand represented by $R^1$—COOH, an organic ligand represented by Chemical Formula 3, and a second organic solvent with a pretreated quantum dot to induce a ligand exchange reaction on a surface of the quantum dot.

More specifically, in the pretreating of the surface of the quantum dot, a pretreatment layer containing a fatty acid based organic ligand and a fatty amine based organic ligand may be formed on the surface of the quantum dot.

Further, in the inducing of the ligand exchange reaction on the surface of the quantum dot, the pretreatment layer may be removed from the surface of the quantum dot and at the same time, a final passivation layer including an organic ligand represented by the following Chemical Formula 2 and the organic ligand represented by the following Chemical Formula 3 may be formed.

$$ABX^1_3 \qquad \text{[Chemical Formula 1]}$$

In Chemical Formula 1, A is one of $CH_3NH_2$, $NH_2CH=NH_1$—*, Cs, Rb, Ba, In, K, and Tl, B is one element of Pb, Sn, Bi, Ag, Ge, and Zr, $X^1$ is one element of F, Cl, Br, and I, and a moiety indicated by * in $NH_2CH=NH_1$—* is bound to B.

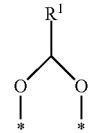

[Chemical Formula 2]

In Chemical Formula 2, $R^1$ is a substituted or unsubstituted (C6-C20) aryl group or substituted or unsubstituted (C1-C6) alkyl group, and moieties indicated by * are each bound to the surface of the quantum dot.

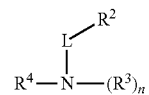

[Chemical Formula 3]

In Chemical Formula 3, L is one of (C1-C5) alkylene groups, $R^2$ to $R^4$ are each one of hydrogen, deuterium, tritium, a substituted or unsubstituted (C1-C6) alkyl group, and a substituted or unsubstituted (C6-C20) aryl group, and n is 0 or 1.

In the applying and coating of the solution containing the surface-passivated quantum dot on the electron transport layer or the polymer electrolyte layer, the solution may be spin-coated at a rotation speed of 200 to 6000 rpm.

Yet another embodiment of the present invention provides a method of manufacturing a quantum dot light emitting diode including: preparing a cathode including a transparent electrode; forming an electron transport layer on the cathode; forming a quantum dot layer on the electron transport layer; forming a hole transport layer on the quantum dot layer; and forming an anode on the hole transport layer, wherein a ligand exchange reaction is carried out on the electron transport layer.

Yet another embodiment of the present invention provides a method of manufacturing a quantum dot light emitting diode including: preparing a cathode including a transparent electrode; forming an electron transport layer on the cathode; forming a polymer electrolyte layer on the electron transport layer; forming a quantum dot layer on the polymer electrolyte layer; forming a hole transport layer on the quantum dot layer; and forming an anode on the hole transport layer, wherein a ligand exchange reaction is carried out on the polymer electrolyte layer.

In detail, the forming of the quantum dot layer on the electron transport layer or the polymer electrolyte layer may include: mixing a pretreatment solution containing a fatty acid based organic ligand, a fatty amine based organic ligand, and a first organic solvent with a perovskite quantum dot (PeQD) containing a compound having a perovskite structure represented by the following Chemical Formula 1 to pretreat a surface of the quantum dot; coating the pretreated quantum dot on the electron transport layer or the polymer electrolyte layer; and applying a ligand exchange solution containing an organic ligand represented by $R^1$—COOH, an organic ligand represented by the following Chemical Formula 3, and a second organic solvent on the electron transport layer or the polymer electrolyte layer to induce a ligand exchange reaction on the surface of the quantum dot coated on the electron transport layer or the polymer electrolyte layer.

More specifically, in the pretreating of the surface of the quantum dot, a pretreatment layer containing the fatty acid based organic ligand and the fatty amine based organic ligand may be formed on the surface of the quantum dot.

Further, in the inducing of the ligand exchange reaction on the surface of the quantum dot coated on the electron transport layer or the polymer electrolyte layer, the pretreatment layer may be removed from the surface of the quantum dot coated on the electron transport layer or the polymer electrolyte layer, and at the same time, a final passivation layer including the organic ligand represented by the following Chemical Formula 2 and the organic ligand represented by the following Chemical Formula 3 may be formed.

$$ABX^1_3 \qquad \text{[Chemical Formula 1]}$$

In Chemical Formula 1, A is one of $CH_3NH_2$, $NH_2CH=NH_1-*$, Cs, Rb, Ba, In, K, and Tl, B is one element of Pb, Sn, Bi, Ag, Ge, and Zr, $X^1$ is one element of F, Cl, Br, and I, and a moiety indicated by * in $NH_2CH=NH_1-*$ is bound to B.

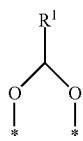

[Chemical Formula 2]

In Chemical Formula 2, $R^1$ is a substituted or unsubstituted (C6-C20) aryl group or substituted or unsubstituted (C1-C6) alkyl group, and moieties indicated by * are each bound to the surface of the quantum dot.

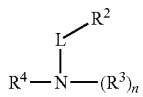

[Chemical Formula 3]

In Chemical Formula 3, L is one of (C1-C5) alkylene groups, $R^2$ to $R^4$ are each one of hydrogen, deuterium, tritium, a substituted or unsubstituted (C1-C6) alkyl group, and a substituted or unsubstituted (C6-C20) aryl group, and n is 0 or 1.

In the coating of the pretreated quantum dot on the electron transport layer or the polymer electrolyte layer, respectively, the pretreated quantum dot may be spin-coated at a rotation speed of 200 to 6000 rpm.

The inducing of the ligand exchange reaction on the surface of the quantum dot coated on the electron transport layer or the polymer electrolyte layer may include: applying the ligand exchange solution on the surface of the quantum dot coated on the electron transport layer or the polymer electrolyte layer; and spin-coating the applied ligand exchange solution.

The method may further include, before the coating of the pretreated quantum dot on the electron transport layer or the polymer electrolyte layer, mixing the pretreated quantum dot and the ligand exchange solution with each other to induce a partial ligand exchange reaction on the surface of the pretreated quantum dot.

In each method, the preparing of the cathode including the transparent electrode may include: washing the transparent electrode; and treating the washed transparent electrode with UV and ozone ($O_3$).

Further, in each method, the forming of the polymer electrolyte layer on the electron transport layer may include: preparing a solution containing one or two or more polymer electrolytes of poly[(9,9-bis(30-(N,N-dimethylamino)propyl)-2,7-fluorene)-alt-2,7-(9,9-dioctylfluorene)] (PFN), polyethylene imine (PEI), and polyethyleneimine ethoxylated (PEIE); and applying and spin-coating the solution containing the polymer electrolyte on the electron transport layer.

Furthermore, in each method, the forming of the anode on the hole transport layer may be performed by depositing a metal thin film made of Al, Ag, Au, or a combination thereof on the hole transport layer.

A description for other contents except for the above-mentioned contents among the descriptions for the exemplary embodiments of the present invention is as widely known in the art.

Advantageous Effect

According to an embodiment of the present invention, the quantum dot of which the surface is passivated with the short chain ligand is introduced into the photo-active layer, such that a surface passivation ratio of a photo-active layer may be high, and thus a photoemission property may be excellently exhibited. Therefore, the quantum dot light emitting diode provided in the exemplary embodiment of the present invention may have improved performance as compared to a general organic light emitting diode.

In other embodiments of the present invention, various methods of manufacturing a quantum dot light emitting diode having excellent performance may be provided.

DESCRIPTION OF THE DRAWINGS

FIGS. 1a to 1c are views schematically illustrating a surface-passivated quantum dot according to an embodiment of the present invention and a method of passivating a surface of a quantum dot according to another embodiment of the present invention.

FIGS. 2a to 2e illustrate evaluation results according to Evaluation Example 1 of the present invention.

FIGS. 3a to 3d illustrate evaluation results according to Evaluation Example 2 of the present invention.

FIG. 4 illustrates an evaluation result according to Evaluation Example 3 of the present invention (scale bar: 100 μm).

FIG. 5 illustrates evaluation results according to Evaluation Example 4 of the present invention.

FIG. 6 illustrates evaluation results according to Evaluation Example 5 of the present invention.

FIG. 7 illustrates evaluation results according to Evaluation Example 6 of the present invention.

BEST MODE FOR INVENTION

Hereinafter, an exemplary embodiment of the present invention is described in detail. However, it is to be understood that this exemplary embodiment is provided as an example, and the present invention is not limited by this exemplary embodiment, but is defined by only the scope of claims to be described below.

Definition of "Substitution" in the Present Specification

In the present specification, unless otherwise defined, the term "substitution" means that at least one hydrogen in a substituent or a compound is substituted with deuterium, a halogen group, a hydroxyl group, an amino group, a substituted or unsubstituted (C1-C30) amine group, a nitro group, a substituted or unsubstituted (C1-C40) silyl group, a (C1-C30) alkyl group, a (C1-C10) alkylsilyl group, a (C3-C30) cycloalkyl group, a (C6-C30) aryl group, and a (C1-C20) alkoxy group, a fluoro group, a (C1-C10) trifluoroalkyl group such as a trifluoromethyl group, or a cyano group.

Further, two adjacent substituents of the substituted halogen group, the hydroxyl group, the amino group, a substituted or unsubstituted (C1-C20) amine group, the nitro group, a substituted or unsubstituted (C3-C40) silyl group, the (C1-C30) alkyl group, the (C1-C10) alkylsilyl group, the (C3-C30) cycloalkyl group, the (C6-C30) aryl group, the (C1-C20) alkoxy group, the fluoro group, the (C1-C10) trifluoroalkyl group such as the trifluoromethyl group, or the cyano group may be fused to form a ring. In detail, the substituted (C6-C30) aryl group may be fused with other substituted (C6-C30) aryl group adjacent thereto to form a substituted or unsubstituted fluorene ring.

In the present specification, unless otherwise defined, the term "hetero" means a functional group containing 1 to 3 hetero atoms selected from the group consisting of N, O, S, and P, the remainder being carbon.

In the present specification, unless otherwise defined, the term "combination thereof" means that two or more substituents are linked with each other by a linker or two or more substituents are condensed to each other to thereby be linked with each other.

In the present specification, unless otherwise defined, the term "alkyl group" means an aliphatic hydrocarbon group. The alkyl group may be a "saturated alkyl group" that does not include a double bond or a triple bond.

The alkyl group may be a (C1-C20) alkyl group. In more detail, the alkyl group may be a (C1-C10) alkyl group or a (C1-C6) alkyl group. For example, a (C1-C4) alkyl group means an alkyl chain including 1 to 4 carbon atoms and is selected from the group consisting of methyl, ethyl, propyl, isopropyl, n-butyl, isobutyl, sec-butyl, and t-butyl.

Specific examples of the alkyl group include a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

In the present specification, the term "aryl group" means a cyclic substitutent of which all elements have a p-orbital and in which these p-orbitals form conjugation, and includes a monocyclic or fused-ring polycyclic functional group (that is, rings which share adjacent pairs of carbon atoms).

In the present specification, the term "heteroaryl group" means an aryl group containing 1 to 3 hetero atoms selected from the group consisting of N, O, S, and P, the remainder being carbon. In the case in which the heteroaryl group is a fused ring, each ring may contain 1 to 3 hetero atoms.

More specifically, examples of a substituted or unsubstituted (C6-C30) aryl group, and/or a substituted or unsubstituted (C2-C30) heteroaryl group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzothiazinyl group, a substituted or unsubstituted acridinyl group, a substituted or unsubstituted phenazinyl group, a substituted or unsubstituted phenothiazinyl group, a substituted or unsubstituted phenoxazinyl group, or a combination thereof, but are not limited thereto.

Definition of "Bond" in the Present Specification

In the present specification, unless otherwise defined, the term "bond" is a concept including a bond between molecules and a bond between atoms. In detail, the term "bond" means a wide concept including van der Waals forces, a covalent bond, an ionic bond, a coordinate bond, and the like.

Exemplary Embodiments of the Present Invention

As described above, recently, an attempt to apply a perovskite based material to a photo-active layer of an organic light emitting device to implement perovskit quantum dot light emitting device (PeQLED) has been conducted.

However, there is a limitation in that in the case of applying quantum dots having a perovskite structure (that is, perovskite quantum dots, hereinafter, referred to as "PeQDs") to the photo-active layer as a single material, only single colored light is exhibited but it is difficult to exhibit multicolored light and implement a large-area device through a solution process. Therefore, a method for changing properties of PeQDs has been required.

In view of this requirement, technologies of forming a passivation film on surfaces of PeQDs using a short chain organic ligand to change the properties of PeQDs have been suggested in exemplary embodiments of the present invention.

More specifically, technologies of controlling a ligand passivating the surfaces of PeQDs (hereinafter, referred to as a "surface passivation ligand") to optimize optical properties thereof and implementing a quantum dot light emitting diode using a short chain ligand exchange method as the control method have been suggested in the exemplary embodiments of the present invention.

Quantum Dot Light Emitting Diode Having Invert Structure

First, a quantum dot light emitting diode provided in an exemplary embodiment of the present invention, which is a quantum dot light emitting diode having an invert structure in which a surface-passivated quantum dot is introduced into a photo-active layer, may be a large-area device implementing multicolored light. In this regard, the photo-active layer into which the quantum dot is introduced is a quantum dot layer.

The quantum dot layer, which is the photo-active layer, includes the surface-passivated quantum dot, such that a surface passivation ratio is high, and thus a photoemission property is excellently exhibited. Therefore, performance of the quantum dot light emitting diode provided in the exemplary embodiment of the present invention may be further improved than that of a general organic light emitting diode.

More specifically, the exemplary embodiment of the present invention provides a quantum dot light emitting diode (QLED) having an invert structure, including: a cathode including a transparent electrode; an electron transport layer positioned on the cathode; a quantum dot layer positioned on the electron transport layer; a hole transport layer positioned on the quantum dot layer; and an anode positioned on the hole transport layer.

PeQDs Having a Surface Passivated with Short Chain Ligands

Materials contained in the quantum dot layer are PeQDs having a surface passivated with short chain ligands satisfying specific Chemical Formulas as described above.

More specifically, the surface-passivated quantum dot includes a quantum dot represented by the following Chemical Formula 1; and a surface treatment layer positioned on a surface of the quantum dot and including an organic ligand represented by the following Chemical Formula 2 and an organic ligand represented by the following Chemical Formula 3.

$$ABX^1_3 \qquad \text{[Chemical Formula 1]}$$

In Chemical Formula 1, A is one of $CH_3NH_3$, $NH_2CH=NH_2$, Cs, Rb, Ba, In, K, and Tl, B is one element of Pb, Sn, Bi, Ag, Ge, and Zr, $X^1$ is one element of F, Cl, Br, and I.

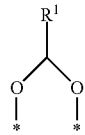

[Chemical Formula 2]

In Chemical Formula 2, $R^1$ is a substituted or unsubstituted (C6-C20) aryl group, and moieties indicated by * are each bound to the surface of the quantum dot.

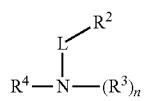

[Chemical Formula 3]

In Chemical Formula 3, L is one of (C1-C5) alkylene groups, $R^2$ to $R^4$ are each one of hydrogen, deuterium, tritium, a substituted or unsubstituted (C1-C6) alkyl group, and a substituted or unsubstituted (C6-C20) aryl group, and n is 0 or 1.

Selection Basis of Surface Passivation Ligand

In the surface-passivated quantum dot, in order to maximize a surface passivation ratio of PeQDs to suppress a surface defect, a chain length of a ligand binding to the surfaces of PeQDs (that is, a surface binding ligand) is decreased.

Specifically, long chain organic ligands (for example, C15 or more) such as oleic acid and oleamine are known to have a rapid diffuse out rate from surfaces of PeQDs in a solution state.

Therefore, in PeQDs passivated with a long chain organic ligand, the long chain organic ligand is rapidly diffused out in the solution state, such that a surface defect site may be increased, and a photoemission property may be deteriorated.

In order to suppress the above-mentioned phenomenon, research for decreasing a ligand diffusion rate by excessively adding the long chain organic ligand to a PeQDs solution and improve a photoluminescence (PL) property has been known.

However, since a residual ligand after excessive addition serves as a kind of insulating factor, excessive addition of the ligand is not an essential solution.

Meanwhile, a short chain ligand (for example, C10 or less) is a ligand that is not dissolved in a solvent of the PeQDs solution and has a low diffusion rate. In PeQDs passivated with the short chain ligand as described above, coupling may be enable due to a narrow particle to particle distance, and thus, electronic properties may be improved.

However, it is difficult to form conditions for passivating the surfaces of PeQDs with the short chain ligand as described above, such that related research is insufficient up to now.

More specifically, since an alkyl based short chain ligand has a low boiling point, thermal evaporation easily occurs under a vacuum condition, and thus, it is hard for the alkyl based short chain ligand to be directly introduced into the surfaces of PeQDs.

Therefore, in the case of directly introducing the alkyl based short chain ligand into the surfaces of PeQDs, a surface passivation ratio by the alkyl based short chain ligand is low, and photoemission property is not satisfactory.

Therefore, there is a need to introduce a ligand having conditions that rigidity and a boiling point are high and a length of a molecule is short, and respective organic ligands represented by Chemical Formulas 2 and 3 satisfy these conditions.

Specifically, the organic ligand represented by Chemical Formula 2 is derived from $R^1$—COOH as described below. Since in $R^1$—COOH, $R^1$ is a substituted or unsubstituted (C6-C20) aryl group, $R^1$ is an organic acid including a benzene ring. In this relation, due to the presence of the benzene ring in $R^1$—COOH, a length of the organic ligand is shorter than that of a linear alkyl chain ligand having the same number of carbon atoms. Therefore, $R^1$—COOH and the organic ligand derived from $R^1$—COOH and represented by Chemical Formula 2 have advantages in that they have relatively high boiling points while having relatively short ligand lengths as compared to the linear alkyl chain ligand having the same number of carbon atoms.

Meanwhile, the organic ligand represented by Chemical Formula 3 may also be a (C6-C20) aryl group in which among $R^2$ to $R^4$, at least one substitutent is substituted or unsubstituted. In this case, the organic ligand has advantages in that it has a relatively high boiling point while having relatively short ligand lengths as compared to the linear alkyl chain ligand having the same number of carbon atoms due to the same principle described above.

Form of Surface Passivation of PeQDs by Ligands Represented by Chemical Formulas 2 and 3

In the organic ligand represented by Chemical Formula 2, moieties indicated by * are each bound to the surface of the quantum dot. Specifically, in a process of passivating the surfaces of PeQDs using an organic ligand represented by $R^1$—COOH as a raw material, H is removed, the organic ligand represented by Chemical Formula 2 is formed, and thus, the moieties indicated by * are each bound to the surface of the quantum dot. A specific bond form may be a coordinated bond or an ionic bond.

Independently, in the case of the organic ligand represented by Chemical Formula 3, N may be bound to the surface of the quantum dot. Specifically, N of the organic ligand represented by Chemical Formula 3 may be bound to the surface of the quantum dot. More specifically, the bond may be a coordinate bond between an unshared electron pair of N and the quantum dot. Meanwhile, based on a total amount of the surface-passivated quantum dot, the quantum dot may be included in an amount of 1 to 50 wt %, the organic ligand represented by Chemical Formula 2 may be included in an amount of 1 to 50 wt %, and the organic ligand represented by Chemical Formula 3 may be the balance.

Further, a weight ratio of the organic ligand represented by Chemical Formula 3 to the organic ligand represented by Chemical Formula 2 (the organic ligand represented by Chemical Formula 3/the organic ligand represented by Chemical Formula 2) may be 1/99 to 99/1.

In the case in which a content of each configuration in the total amount of the surface-passivated quantum dot and the weight ratio of the organic ligand represented by Chemical Formula 3 to the organic ligand represented by Chemical Formula 2 are satisfied, an effect by surface treatment may be appropriately exhibited.

Quantum Dot

The perovskite quantum dots (PeQDs) are not particularly limited as long as they satisfy the above-mentioned Chemical Formula 1.

For example, the perovskite quantum dots may be made of organometal halide perovskite such as methylammonium lead halide, formamidinium lead halide, methylammonium tin halide, and formamidinium tin halide.

Further, the perovskite quantum dots may be made of all inorganic perovskite such as cesium lead halide, cesium tin halide, cesium silver halide, rubidium lead halide, rubidium tin halide, and rubidium silver halide.

Diameter of Quantum Dot, Thickness and Area Distribution of Passivation Layer

Regardless of Chemical Formula of PeQDs, a diameter thereof may be 3 to 30 nm. A thickness of the passivation layer may be 5 to 500 nm. When the diameter of the quantum dot and the thickness range of the surface treatment layer are satisfied, respectively, an effect of improving a photoluminescence property may be obtained. Further, in the surface (100 sq %) of the quantum dot, the passivation layer may be distributed in a ratio of 1 to 100 sq %.

Thickness, Area Distribution, and Density of Quantum Dot Layer

The quantum dot layer may have a total thickness of 1 to 300 nm. In the case in which the thickness of the quantum dot layer satisfies this range, a device may be stably driven. However, in the case in which the thickness exceeds the upper limit thickness, there is a problem in injecting a carrier, and in the case in which the thickness is less than a lower limit thickness, there is a problem in a film coverage.

Specifically, the quantum dot layer may include a thin film of 1 to 10 layers in which a thickness of one layer is 1 to 30 nm. This is depending on a manufacturing method to be described below, and it may be confirmed in Evaluation Example 3 that the thickness of one thin film layer satisfies 1 to 30 nm, and it is impossible to form a thin film of more than 10 layers.

In addition, the surface-passivated quantum dot may be uniformly distributed in a front surface of the quantum dot layer. Specifically, the surface-passivated quantum dot may be distributed in a ratio of 80 sq % or more based on the front surface (100 sq %) of the quantum dot layer. This is also an advantage depending on a manufacturing method to be described below.

Further, in the quantum dot layer, the surface-passivated quantum dot may be distributed in a ratio of 80 to 100 vol % based on a total volume (100 vol %).

The thickness, area distribution, and volume distribution properties as described above mean that it is possible to implement a high density quantum dot layer having a desired thin film thickness within 10 layers and a uniform surface quality almost without a defect, furthermore, it is possible to implement a quantum dot light emitting diode having excellent performance.

Abstract of Method of Forming Quantum Dot Layer

The passivation layer may be formed by a solid-state ligand exchange (SLE) reaction.

More specifically, the quantum dot may be formed on the electron transport layer using PeQDs on which a final passivation layer is eventually formed by treating PeQDs pretreated with a long chain organic ligand with a ligand exchange solution to induce the solid-state ligand exchange (SLE) reaction.

Independently, a quantum dot layer including finally passivated quantum dots may be obtained on the electron transport layer by coating PeQDs pretreated with a long chain organic ligand on the electron transport layer and treating a coated surface on the electron transport layer with a ligand exchange solution to induce the solid-state ligand exchange (SLE) reaction.

More detailed contents of a method of forming a passivation layer on the surface of the quantum dot and a method of forming a quantum dot layer including the finally passivated quantum dot will be described below.

Polymer Electrolyte Layer

Meanwhile, the quantum dot light emitting diode may further include a polymer electrolyte layer positioned between the electron transport layer and the quantum dot layer.

In this case, the quantum dot layer may be formed on the polymer electrolyte layer using PeQDs on which a final passivation layer is eventually formed by treating PeQDs pretreated with a long chain organic ligand with a ligand exchange solution to induce the solid-state ligand exchange (SLE) reaction.

Independently, a quantum dot layer including finally passivated quantum dots may be obtained on the polymer electrolyte layer by coating PeQDs pretreated with a long chain organic ligand on the electron transport layer and treating a coated surface on the polymer electrolyte layer with a ligand exchange solution to induce the solid-state ligand exchange (SLE) reaction.

The polymer electrolyte layer may be made of one or two or more polymer electrolytes of poly[(9,9-bis(30-(N,N-dimethylamino)propyl)-2,7-fluorene)-alt-2,7-(9,9-dioctylfluorene)] (PFN), polyethylene imine (PEI), and polyethyleneimine ethoxylated (PEIE)

Electron Transport Layer, Hole Transport Layer, Cathode, and Anode

A description of other configurations of the quantum dot light emitting diode is as follows.

As the electron transport layer, nanoparticles, nanowires, or a thin film of metal oxides such as ZnO, $TiO_2$, SnO, $SrTiO_3$, and $BaTiO_3$ may be applied. Alternatively, the electron transport layer may be a thin film containing at least one of bathocuproine (BCP), bathophenanthroline (Bphene), 3-(biphenyl-4-yl)-5-(4-tert-butylphenyl)-4-phenyl-4H-1,2, 4-triazole (TAZ), tris(8-hydroxyquinolinato)aluminum (Alq3), 1,3,5-tris(2-N-phenylbenzimidazolyl)benzene (TPBi), and 1,3,5-triazine (T2T). However, this description is provided by way of example.

A thickness of the electron transport layer may be 5 to 200 nm, but is not limited thereto.

The hole transport layer may be a thin film containing at least one of N,N'-di(1-naphthyl)-N,N'-diphenyl-(1,1'-biphenyl)-4,4"-diamine (a-NPD), N,N'-di(1-naphthyl)-N,N'-diphenyl-(1,1'-biphenyl)-4,4"-diamine (NPB), 4,4'-cyclohexylidenebis[N,N-bis(4-methylphenyl)benzenamine] (TAPC), 1,4,5,8,9,11-hexaazatriphenylene hexacarbonitrile (HAT-CN), PEDOT:PSS, 4,4'-bis(N-carbazolyl)-1,1'-biphenyl (CBP), amorphous_4,4'-bis(N-carbazolyl)-1,1'-biphenyl (mCBP), 2,2',7,7'-tetrakis[N,N-di(4-methoxyphenyl) amino]-9,9'-spirobifluorene (Spiro-OMeTAD), and poly(9-vinylcarbazole) (PVK), but is not limited thereto.

A thickness of the hole transport layer may be 5 to 200 nm, but is not limited thereto.

Meanwhile, a work function of the quantum dot layer is controlled by the polymer electrolyte layer, such that a ratio of an electron injection rate to a hole injection rate (electron injection rate/hole injection rate) may be adjusted.

Further, an injection rate of electrons and holes into the photo-active layer may be adjusted almost to be 1:1 by controlling a thickness to the polymer electrolyte layer to be more than 0 time to 2 times or less the thickness of the quantum dot layer, and thus, efficiency of the device may be increased.

The cathode includes the transparent electrode, and generally, a transparent electrode made of a material having a large work function may be used so that holes may be smoothly injected into an organic thin film layer. Specific examples of the material having a large work function may include metals such as nickel, platinum, vanadium, chromium, copper, zinc, and gold and alloys thereof, metal oxides such as zinc oxide, indium oxide, indium tin oxide (ITO), and indium zinc oxide (IZO), a combination of a metal and oxide such as a combination of ZnO and Al or a combination of $SnO_2$ and Sb, conductive polymers such as poly(3-methylthiophene), poly(3,4-(ethylene-1,2-dioxy) thiophene (polyethylenedioxythiophene; PEDT), polypyrrole, polyaniline, and the like, but are not limited thereto.

The anode contains an anode material, and as the anode material, generally, a material having a small work function may be preferably used so that electrons may be smoothly injected into an organic thin film layer. Specific examples of the anode material may include metals such as magnesium, calcium, sodium, potassium, titanium, indium, ittrium, lithium, gadolinium, aluminum, silver, tin, lead, cesium, and barium, or alloys thereof and a multilayer structure material such as LiF/Al, $LiO_2$/Al, LiF/Ca, LiF/Al, and $BaF_2$/Ca, but are not limited thereto.

Parameters Related to Performance of Quantum Dot Light Emitting Diode

At the time of analyzing a visible light spectrum of the quantum dot light emitting diode, a full width at half maximum (FWHM) may be 10 to 40 nm.

Further, at the time of analyzing a visible light spectrum of the quantum dot light emitting diode, an electroluminescence intensity may be 100 $cd/m^2$ or more, specifically, 200 $cd/m^2$ or more in a wavelength region of 430 to 720 nm.

Specifically, as in Evaluation Example to be described below, in a red wavelength region (680 nm), an electroluminescence intensity may be 200 $cd/m^2$ or more, in a green wavelength region (510 nm), an electroluminescence intensity may be 300 $cd/m^2$ or more, and in a blue wavelength region (488 nm), an electroluminescence intensity may be 300 $cd/m^2$ or more, such that an excellent electroluminescence intensity may be obtained in a whole the visible light wavelength range.

Method of Manufacturing Quantum Dot Light Emitting Diode Having Invert Structure Hereinafter, the above-mentioned contents of the method of forming a passivation layer on the surface of the quantum dot and the method of forming a quantum dot layer including the finally passivated quantum dot will be described in more detail.

Specifically, in relation to the method of forming a passivation layer on the surface of the quantum dot, two methods of passivating surface of PeQDs with a long chain ligand to form a pretreatment layer, and then removing the long chain ligand from the surfaces of PeQDs through a ligand exchange reaction and passivating the surfaces with a short chain ligand will be suggested. The reason is that chain lengths of the chain lengligands represented by Chemical Formulas 2 and 3 are too long to be directly introduced into the surfaces of PeQDs, and thus, there is a problem such as an increase in internal resistance of the device.

In this regard, there are two methods of forming a quantum dot layer including a finally passivated quantum dot.

Specifically, FIGS. 1a to 1c are schematic views for describing exemplary embodiments of the present invention, and hereinafter, a detailed description will be provided with reference to FIGS. 1a to 1c.

FIGS. 1a and 1b illustrate a method of forming the quantum dot layer using PeQDs on which a final passivation layer is eventually formed by treating PeQDs pretreated with a long chain organic ligand with a ligand exchange solution to induce a solid-state ligand exchange (SLE) reaction, separately from the polymer electrolyte layer.

Further, FIG. 1c illustrates a method of coating PeQDs pretreated with a long chain organic ligand on the electron transport layer or the polymer electrolyte layer, treating a coated surface on the electron transport layer or the polymer electrolyte layer with a ligand exchange solution to induce the solid-state ligand exchange (SLE) reaction, and obtaining a quantum dot layer including finally passivated quantum dots on the electron transport layer or the polymer electrolyte layer.

(1) Case of Passivating Surface of Quantum Dot Separately from Electron Transport Layer or Polymer Electrolyte Layer First, the method of passivating the surface of the quantum dot, separately from the electron transport layer or the polymer electrolyte layer includes: mixing a pretreatment solution containing a fatty acid based organic ligand, a fatty amine based organic ligand, and a first organic solvent with a perovskite quantum dot (PeQD) containing a compound having a perovskite structure represented by the following Chemical Formula 1 to pretreat a surface of the quantum dot; and mixing a ligand exchange solution containing an organic ligand represented by $R^1$—COOH, an organic ligand represented by Chemical Formula 2, and a second organic solvent with the pretreated quantum dot to induce a ligand exchange reaction on the surface of the quantum dot.

More specifically, in the pretreating of the surface of the quantum dot, a pretreatment layer containing the fatty acid based organic ligand and the fatty amine based organic ligand is formed on the surface of the quantum dot.

Further, in the inducing of the ligand exchange reaction on the surface of the quantum dot, the pretreatment layer is removed from the surface of the quantum dot, and at the same time, the final passivation layer containing the organic ligand represented by Chemical Formula 2 and the organic ligand represented by Chemical Formula 3 is formed.

Process of Forming Pretreatment Layer

Specifically, a process of forming the pretreatment layer on the surfaces of PeQDs is performed by a solution process using the fatty acid based organic ligand and the fatty amine based organic ligand as the long chain ligands and using a solvent (specifically, the first organic solvent).

In this case, the fatty acid based organic ligand may include one or a mixture of two or more of all fatty acid based organic ligands known in the art. Examples thereof include oleic acid, stearic acid, and the like.

The fatty amine based organic ligand may include one or a mixture of two or more of all fatty amine based organic ligands known in the art. Examples thereof include oleylamine, dodecyl amine, and the like.

Further, as the first organic solvent, one or a mixture of two or more of hexane, toluene, benzene, octane, chloroform, chlorobenzene, dichlorobenzene, ortho-xylene, meta-xylene, and para-xylene may be used.

More specifically, the surfaces of PeQDs may be pretreated by mixing the fatty acid based organic ligand and the fatty amine based organic ligand with each other in the first organic solvent to prepare a pretreatment solution and mixing the pretreatment solution and PeQDs.

In this regard, the pretreatment solution having a total volume of 100 vol % may be prepared by allowing the fatty acid based organic ligand and the fatty amine based organic ligand to be contained therein in a total content of 0.00001 to 20 vol % and the first organic solvent to be the balance.

The pretreatment solution satisfying the above-mentioned composition may be suitable for forming a pretreatment layer having an appropriate thickness as compared to a diameter of the quantum dot and for being removal by a ligand exchange reaction to be described below. However, when the content is more than 20 vol %, there is a problem in that the thickness of the pretreatment layer becomes excessively thick and thus the quantum dot is decomposed, and when the content is less than 0.00001 vol %, there is a problem in that the thickness of the pretreatment layer becomes excessively thin.

Ligand Exchange Reaction

Thereafter, the ligand exchange reaction of the pretreated PeQDs may be performed under a liquid-state or solid-state condition. A condition of the ligand exchange reaction is distinguished depending on a state (liquid state) in which the pretreated PeQDs are dispersed in the first solvent and a state (solid state) in which the pretreated PeQDs are dried.

The pretreatment layer is removed from the surfaces of PeQDs and a final surface treatment layer is formed by applying the ligand exchange solution to the pretreated PeQDs regardless of the condition.

In this case, the ligand exchange solution contains short chain ligands to be exchanged with the pretreatment layer and the solvent (second organic solvent).

Ligands Used in Ligand Exchange Reaction

Here, the short chain ligands exchanged with the pretreatment layer are the organic ligand represented by Chemical Formula 2 and the organic ligand represented by Chemical Formula 3 in the surfaces of PeQDs.

In this regard, the organic ligand represented by $R^1$—COOH may become the organic ligand represented by Chemical Formula 2 in the surfaces of PeQDs by removal of H in the second solvent. Therefore, the organic ligand represented by $R^1$—COOH is applied to the ligand exchange solution.

Meanwhile, the organic ligand represented by Chemical Formula 3 is attached to the surfaces of PeQDs without a chemical change in the second solvent. Therefore, the organic ligand represented by Chemical Formula 3 is applied to the ligand exchange solution.

Solvent Used in Ligand Exchange Reaction

As described above, the long chain ligand has high solubility regardless of the kind of solvent, and thus, the long chain ligand is easily diffused out from the surfaces of PeQDs. Therefore, in order to remove the pretreatment layer, any solvent may be used as the second solvent.

However, in the exemplary embodiment of the present invention, a solvent having low solubility for the short chain ligands exchanged with the pretreatment layer is selected as a main solvent, such that the long chain ligand is diffused out from the surfaces of PeQDs, and the short chain ligands are passivated in the surfaces of PeQDs. Of course, the main solvent should have a good dispersion property with respect to PeQDs. For example, the main solvent may be hexane, octane, heptane, or a combination thereof.

In this case, only the main solvent may be used as the second solvent, but solubility of the short chain ligands may be increased by using a sub-solvent in addition to the main solvent.

For example, the anti-solvent may be benzene, toluene, xylene (o-, m-, and p-xylene), or a combination thereof.

In the case of using both the main solvent and the sub-solvent as the second solvents, there is a need to control a volume ratio of the anti-solvent to the main solvent to be 1/99 to 99/1. When the volume ratio satisfies this range, a control of a diffusion rate by the main solvent and a control of solubility by the anti-solvent with respect to the short chain ligands may be appropriately balanced.

However, in the case in which the volume ratio is exceed the above-mentioned range and thus, the sub-solvent is excessively contained, a content of the main solvent is rather decreased, such that the diffusion rate of the short chain ligands is increased, and thus, a surface defect may be increased in the finally passivated PeQDs.

Even though the content of the sub-solvent is less than the above-mentioned range to thereby be small, there is no problem, but an effect by the sub-solvent may be insufficient.

Content of Each Material in Ligand Exchange Reaction Solution

In the ligand exchange solution, a volume ratio of the organic ligand represented by Chemical Formula 3 to the organic ligand represented by $R^1$—COOH (the organic ligand represented by Chemical Formula 3/the organic ligand represented by Chemical Formula 2) may be 1/99 to 99/1.

The reason is that the organic ligand represented by $R^1$—COOH and the organic ligand represented by Chemical Formula 3 become ligands finally passivating the surfaces of PeQDs, and thus, a composition of the final surface treatment layer is considered.

Meanwhile, the pretreatment solution having a total volume of 100 vol % may be prepared by allowing the organic ligand represented by $R^1$—COOH and the organic ligand represented by Chemical Formula 3 to be contained therein in a total content of 0.00001 to 20 vol % and the second organic solvent to be the balance.

The ligand exchange solution may be suitable for forming the final passivation layer at a suitable thickness as compared to the diameter of the quantum dot while removing the pretreatment layer from the surfaces of the pretreated PeQDs. However, when the content is more than 20 vol %, there is a problem in that the thickness of the final passivation layer becomes excessively thick and thus the quantum dot is decomposed, and when the content is less than 0.00001 vol %, there is a problem in that the thickness of the final passivation layer becomes excessively thin.

Application Amount of Ligand Exchange Solution 0.1 to 100 mg of the pretreated quantum dot may be mixed based on 1 mL of the ligand exchange solution.

When this is satisfied, it is possible to form the pretreatment layer having a suitable thickness as compared to the diameter of the quantum dot. However, when the amount of the quantum dot is more than 100 mg, a dispersion property of each material in the solution may be decreased, and when the amount of the quantum dot is less than 0.1 mg, decomposition of the quantum dot may easily occur.

However, in the case in which the ligand exchange reaction is carried out under the liquid-state condition, after the reaction proceeds to some extent, a colloidal property of the reaction solution may be lost, and precipitation of PeQDs may occur. This phenomenon is caused by a short chain length of the ligands used in the ligand exchange reaction.

Therefore, in the case in which the ligand exchange reaction is carried out under the liquid-state condition, there is a need to sensitively control a process condition thereof.

(2) Case of Passivating Surface of Quantum Dot on Electron Transport Layer or Polymer Electrolyte Layer Meanwhile, in the case of the solid-state ligand exchange reaction (in which ligand exchange reaction proceeds under a solid-state condition), a process control may be easy.

More specifically, after coating the pretreated PeQDs on the electron transport layer or the polymer electrolyte layer (solid-state), the ligand exchange solution may be applied on the electron transport layer or the polymer electrolyte layer coated with the pretreated PeQDs. In this case, the ligand exchange reaction is induced on the surfaces of the pretreated PeQDs coated on the electron transport layer or the polymer electrolyte layer, and a passivation ratio by the short chain ligand may be further improved.

In this regard, in Evaluation Example to be described below, it was confirmed that the quantum dot of which the surface was passivated with the short chain ligand was manufactured by performing the ligand exchange reaction on the electron transport layer or the polymer electrolyte layer and at the same time, a thin film including the quantum dot of which the surface was passivated was uniformly formed to have a desired thickness. This means that a quantum dot light emitting diode having excellent performance may be implemented by forming a quantum dot layer having a desired thin film thickness within 10 layers on an arbitrary substrate as well as the electron transport layer or the polymer electrolyte layer, and achieving uniform surface quality almost without a defect.

In more detail, the method of passivating the surface of the quantum dot layer on the electron transport layer or the polymer electrolyte layer may include: mixing a pretreatment solution containing a fatty acid based organic ligand, a fatty amine based organic ligand, and a first organic solvent with a perovskite quantum dot (PeQD) containing a compound having a perovskite structure represented by Chemical Formula 1 to pretreat a surface of the quantum dot; coating the pretreated quantum dot on the electron transport layer or the polymer electrolyte layer; and applying a ligand exchange solution containing an organic ligand represented by $R^1$—COOH, an organic ligand represented by Chemical Formula 2, and a second organic solvent on the electron transport layer or the polymer electrolyte layer to induce a ligand exchange reaction on the surface of the quantum dot coated on the electron transport layer or the polymer electrolyte layer.

More specifically, in the pretreating of the surface of the quantum dot, a pretreatment layer containing the fatty acid based organic ligand and the fatty amine based organic ligand is formed on the surface of the quantum dot.

Further, in the inducing of the ligand exchange reaction on the surface of the quantum dot coated on the electron transport layer or the polymer electrolyte layer, the pretreatment layer is removed from the surface of the quantum dot coated on the electron transport layer or the polymer electrolyte layer, and at the same time, a final passivation layer including the organic ligand represented by Chemical Formula 2 and the organic ligand represented by Chemical Formula 3 is formed.

Process of Pretreatment Layer

Even in performing the ligand exchange reaction on the electron transport layer or the polymer electrolyte layer, a method of pretreating PeQDs is the same as that in case of pretreating PeQDs separately from the electron transport layer or the polymer electrolyte layer. Since contents thereof are the same as described above, a detailed description thereof will be omitted.

Process of Coating Pretreated PeQDs on Polymer Electrolyte Layer

A method of coating the pretreated PeQDs on the electron transport layer or the polymer electrolyte layer may be a spin-coating method, a dip-coating method, or the like. Of course, since this coating method is a kind of solution method, the ligand exchange solution needs to be applied in a dried state (solid-state) after removing a solvent used in the coating.

For example, a solution for spin-coating may be a solution in which the pretreated PeQDs are dispersed using the second organic solvent as a solvent.

In detail, a solution obtained by dispersing the pretreated PeQDs so as to have a concentration of 0.1 to 100 mg per 1 mL of the second solvent may be spin-coated on the electron transport layer or the polymer electrolyte layer.

In the coating of the pretreated quantum dot on the electron transport layer or the polymer electrolyte layer, the pretreated quantum dot may be spin-coated at a rotation speed of 200 to 6000 rpm.

Partial Ligand Exchange Reaction of Pretreated PeQDs

Meanwhile, in the case of applying the ligand exchange solution on the electron transport layer or the polymer electrolyte layer coated with the pretreated PeQDs, the pretreated PeQDs themselves may be washed out from the electron transport layer or the polymer electrolyte layer by the ligand exchange solution. This is caused by the long chain ligand positioned on the surfaces of the pretreated PeQDs.

Therefore, an intermediate passivation layer may be formed by reacting the pretreated PeQDS and the ligand exchange solution with each other to partially remove the long chain ligand and partially passivate the short chain ligand on the surfaces of the PeQDs before coating the pretreated PeQDs on the electron transport layer or the polymer electrolyte layer.

Here, based on 100 vol % of the pretreated quantum dot when absorbance of the pretreated quantum dot is 0.1, 0.5 vol % to 20 vol % of the ligand exchange solution may be mixed with the pretreated quantum dot. In the case of coating the PeQDs on which the intermediate passivation layer is formed on the electron transport layer or the polymer electrolyte layer and applying the ligand exchange solution on this electron transport layer or polymer electrolyte layer, a passivation ratio by the short chain ligand in a finally obtained passivation layer may be more excellent.

Final Ligand Exchange Reaction

Regardless of the liquid-state or solid-state condition, whether or not the process of forming the intermediate passivation layer is included, or the like, a final ligand exchange reaction is carried out on the electron transport layer or the polymer electrolyte layer.

In detail, the above-mentioned ligand exchange solution may be applied on the electron transport layer or the polymer electrolyte layer coated with the pretreated PeQDs or PeQDs in which the partial ligand exchange reaction is carried out.

Therefore, the pretreatment layer is removed form the surface of the quantum dot coated on the electron transport layer or the polymer electrolyte layer, and at the same time, the final passivation layer containing the organic ligand represented by the following Chemical Formula 2 and the organic ligand represented by the following Chemical 3 may be formed.

A method of applying the ligand exchange solution on the electron transport layer or the polymer electrolyte layer may be a spin-coating method, a dip-coating method, or the like, but is not limited thereto.

Meanwhile, a description of configuration materials of the ligand exchange solution and contents thereof is the same as described above.

Process of Removing Residual Ligand

The method may further include a process of removing a residual ligand after forming the final passivation layer.

The above-mentioned sub-solvent may be used as a washing solution removing the residual ligand. In the case of forming the final passivation layer on the electron transport layer or the polymer electrolyte layer, a method of applying and spin-coating the washing solution on the electron transport layer or the polymer electrolyte layer may be used.

(1) Descriptions Common in Two Methods

Regardless of the method of forming the passivation layer on the surface of the quantum dot and the method of forming the quantum dot layer including the finally passivated quantum dot, the methods of manufacturing a quantum dot light emitting diode according to the exemplary embodiments of the present invention include: preparing a cathode including a transparent electrode; forming an electron transport layer on the cathode; forming a polymer electrolyte layer on the electron transport layer; forming a quantum dot layer on the polymer electrolyte layer; forming a hole transport layer on the quantum dot layer; and forming an anode on the hole transport layer, or include forming a quantum dot layer on the electron transport layer instead of the forming of the polymer electrolyte layer on the electron transport layer; and the forming of the quantum dot layer on the polymer electrolyte layer.

In each method, the preparing of the cathode including the transparent electrode may include: washing the transparent electrode; and treating the washed transparent electrode with UV and ozone ($O_3$).

Further, the forming of the electron transport layer on the cathode may be performed by applying a solution process, a deposition process, an atomic layer deposition (ALD) process, a chemical vapor deposition (CVD) process, using nanoparticles or nanowires based on a metal oxide made of $ZnO$, $TiO_2$, $SnO$, $SrTiO_3$, $BaTiO_3$, or the like, and but is not limited thereto.

In each method, the forming of the anode on the hole transport layer may be performed by applying a solution process or a deposition process using a material such as Al, Ag, Au, or a combination thereof, but is not limited thereto.

Meanwhile, the forming of the polymer electrolyte layer on the electron transport layer may include: preparing a solution containing one or two or more polymer electrolytes of poly[(9,9-bis(30-(N,N-dimethylamino)propyl)-2,7-fluorene)-alt-2,7-(9,9-dioctylfluorene)] (PFN), polyethylene imine (PEI), and polyethyleneimine ethoxylated (PEIE); and applying and spin-coating the solution containing the polymer electrolyte on the electron transport layer.

A description for other contents except for the above-mentioned contents among the descriptions for the exemplary embodiments of the present invention is as widely known in the art.

MODE FOR INVENTION

Hereinafter, specific examples of the present invention will be described. However, Examples to be described below are provided in order to specifically exemplify or describe the present invention, and the present invention is not limited thereto.

I. Evaluation of Physical Properties of PeQDs

Manufacturing Example 1 (Passivation of Surfaces of PeQDs)

(1) Pretreatment Process

As PeQDs, PeQDs represented by Chemical Formula $CsPbX_3$ (X=Cl, I and Br) and having a particle diameter of 9 nm were used.

Further, oleic acid was used as a fatty acid based organic ligand, oleylamine was used as a fatty amine based organic ligand, and hexane was used as a first organic solvent, such that a pretreatment solution was prepared.

The fatty acid based organic ligand and the fatty amine based organic ligand were contained at a content of 2.5 vol % based on a total volume (100 vol %) of the pretreatment solution, and the first organic solvent was contained as the balance. Further, a volume ratio of the fatty acid based organic ligand and the fatty amine based organic ligand in the pretreatment solution was 1:1.

40 mg of PeQDs was injected per 1 mL of the pretreatment solution, thereby forming a pretreatment layer on surfaces of PeQDs. The pretreatment layer contained the fatty acid based organic ligand and the fatty amine based organic ligand.

(2) Preparation of Ligand Exchange Solution

As an organic ligand represented by $R^1$—COOH, benzoic acid ($C_6H_5COOH$) was used, and as an organic ligand represented by the above-mentioned Chemical Formula 3, an amine based ligand represented by Chemical Formula $C_6H_5CH_2CH_2CH_2CH_2NH_2$ was used, and as a second organic solvent, a solvent in which benzene and octane was mixed with each other at a volume ratio of 1/9 was used, such that two ligand exchange solutions were prepared as follows.

1) Based on a total volume (100 vol %) of the ligand exchange solution, the organic ligand represented by $R^1$—COOH and the organic ligand represented by Chemical Formula 3 were contained at a total content of 1.25 vol %, and the second organic solvent was contained as the balance. A volume ratio of the ligand exchange solution, the organic ligand represented by $R^1$—COOH and the organic ligand represented by Chemical Formula 3 was 1:1.

2) Based on a total volume (100 vol %) of the ligand exchange solution, the organic ligand represented by $R^1$—COOH and the organic ligand represented by Chemical Formula 3 were contained at a total content of 5 vol %, and the second organic solvent was contained as the balance. A volume ratio of the ligand exchange solution, the organic ligand represented by $R^1$—COOH and the organic ligand represented by Chemical Formula 3 was 1:1.

(3) Partial Ligand Exchange Reaction

These two ligand exchange solutions were each reacted with the pretreated PeQDs.

Specifically, 40 mg of the pretreated PeQDs was injected per 1 mL of the ligand exchange solution. Therefore, long chain ligands were partially removed from the surfaces of PeQDs, and short chain ligands were partially passivated, such that an intermediate passivation layer was formed.

(4) Final Ligand Exchange Reaction

A substrate made of a glass material coated with ITO and having a total thickness of 1.0 T was used, and a final ligand exchange process was performed on the substrate.

To this end, a coating solution was prepared by dispersing 40 mg of PeQDs on which the intermediate passivation layer was formed per 1 mL of the second solvent.

40 uL of the coating solution was taken, spin-coated on the substrate, and dried, thereby forming a thin film having a thickness of 40 nm.

50 uL of each of the two ligand exchange solutions was applied on the thin film formed on the substrate by a spin-coating method. Accordingly, a final ligand exchange reaction was carried out.

Therefore, a substrate on which the thin film including PeQDs having a final passivation layer formed thereon was formed was obtained.

(5) Process of Removing Residual Ligands

A washing process was performed by applying and spin-coating benzene on the substrate subjected to the final ligand exchange process.

Therefore, PeQDs on which the final passivation layer was formed was obtained on the substrate.

Manufacturing Comparative Example 1 (PeQDs on which Pretreatment Layer was Formed)

PeQDs on which a pretreatment layer was formed were obtained by performing a washing process after a pretreatment process in Manufacturing Example 1.

Evaluation Example 1

Shape and surface properties depending on the presence or absence of surface treatment of PeQDs were evaluated.
(1) Transmission Electron Microscope (TEM) Image FIG. 2a is a transmission electron microscope (TEM) image in Manufacturing Comparative Example 1, and FIGS. 2B and 2C are TEM images in Manufacturing Example 1, and states of each surface may be confirmed.

Specifically, it may be confirmed that components of a surface in Manufacturing Comparative Example 1 were oleic acid and oleylamine, components of a surface passivated with 1.25 vol % of the ligand exchange solution in Manufacturing Example 1 were benzoic acid and 4-phenylbutylamine, and components of a surface passivated with 5 vol % of the ligand exchange solution in Manufacturing Example 1 were benzoic acid and 4-phenylbutylamine.

(2) Fourier-Transform Infrared Spectroscopy (FT-IR) Analysis

Meanwhile, FIGS. 2d and 2e illustrate FT-IR analysis results of PeQDs on which the pretreatment layer was formed, PeQDs on which the intermediate passivation layer was formed, and PeQDs on which the final passivation layer was formed, and a ligand positioned in each surface may be confirmed.

Specifically, FIG. 2d shows transmittance in a region of 1300 to 3200 $cm^{-1}$, and an entire peak shape and shift may be evaluated through FIG. 2d.

In FIG. 2d, the presence of the ligand having a long chain in PeQDs on which the pretreatment layer was formed may be confirmed from a peak in a region of 2840 to 2959 $cm^{-1}$. Further, it may be confirmed that in PeQDs on which intermediate passivation layer was formed, a peak in a region of 2840 to 2959 $cm^{-1}$ was decreased, and a peak at 1395 $cm^{-1}$ was formed.

Meanwhile, it may be confirmed that in PeQDs on which the final passivation layer (passivated with 5 vol % of the ligand exchange solution) was formed, a decrease of a peak in a region of 2840 to 2959 $cm^{-1}$ was increased, and an increase of a peak at 1395 $cm^{-1}$ was also increased, as compared to PeQDs on which the intermediate passivation layer was formed.

It may be appreciated through the above-mentioned results that a long chain ligand was substituted with a short ligand.

Further, FIG. 2e shows transmittance in a region of 1300 to 1800 $cm^{-1}$, it may be confirmed that particularly, in PeQDs on which the final passivation layer was formed, a peak at 1395 $cm^{-1}$ was noticeable.

In PeQDs on which the pretreatment layer was formed, a peak at 1395 $cm^1$ was minute, and in PeQDs on which the intermediate passivation layer was formed, the peak at 1395 $cm^{-1}$ was gradually exhibited.

A ligand exchange reaction may be proven through this peak at 1395 $cm^{-1}$.

Evaluation Example 2 (Evaluation of Photoluminescence Through Time-Correlated Single Photon Counting (TCSPC) Result)

In order to evaluate optical properties depending on ligand exchange, time correlated single photon counting (TCSPC) analysis was performed, and the results thereof were illustrated in FIGS. 3A to 3D.

(1) First, in FIG. 3a, as red, green, and blue PeQDs were used, relative photoluminescence (PL) intensities were confirmed.

Specifically, a quantum dot, which is a target of surface passivation, was differently selected depending on a luminescence color. In the case of a red color, a $CsPbI_3$ quantum dot was selected, in the case of a green color, a $CsPbBr_3$ quantum dot was selected, and in the case of a blue color, a $CsPbClBr_2$ quantum dot was selected, such that in each case, a pretreatment process, a partial passivation process, and a final passivation process were sequentially performed in the same manner as in Manufacturing Example 1.

However, a ligand content in each ligand exchange solution was variously set to 1 vol %, 1.25 vol %, 5 vol %, 10 vol %, and 15 vol %.

Separately, each pretreated quantum dot was obtained by performing the processes on the quantum dot depending on each luminescence color only up to the pretreatment process in Manufacturing Example 1.

As a result, in FIG. 3a, bandgaps of the quantum dots used in an experiment were confirmed through absorbance and luminescence analysis.

(2) Further, in FIG. 3b, differences depending on chain lengths and structures of the ligand were confirmed.

Specifically, as the quantum dot, the $CsPbBr_3$ quantum dot was selected. Further, in an alkyl amine based organic ligand or benzyl amine based organic ligand as amine based organic ligands among organic ligands for pretreatment, the number of carbon atoms configuring a chain of each organic ligand was variously set to 6, 8, 12, 16, 18, and the like. In addition, a mixture in which benzoic acid and each amine based ligand were mixed at a volume ratio of 1/1 (benzoic acid/amine based ligand) was used as the organic ligand for pretreatment, and the processes on the quantum dot were performed only up to the pretreatment process in Manufacturing Example 1, and a resultant obtained by freeze-drying the pretreated quantum dot was used for analysis.

As a result, in FIG. 3b, luminescence performance depending on the number of carbon atoms of the ligand may be confirmed, and it may be confirmed that a maximum photoluminescence property was maintained at a minimum number of carbon atoms tested with respect to an aromatic ligand.

(3) In FIG. 3c, photoluminescence intensities depending on Chemical Formula of a quantum dot and a ligand content were compared with each other.

Specifically, a quantum dot, which was a surface passivation target, was differently selected depending on a luminescence color. In the case of a red color, a $CsPbI_3$ quantum dot was selected, in the case of a green color, a $CsPbBr_3$ quantum dot was selected, and in the case of a blue color, a $CsPbClBr_2$ quantum dot was selected, such that in each case, a pretreatment process, a partial passivation process, and a final passivation process were sequentially performed in the same manner as in Manufacturing Example 1.

However, a ligand content in each ligand exchange solution was variously set to 5 vol %, 10 vol %, and 15 vol %.

Separately, each pretreated quantum dot was obtained by performing the process on the quantum dot depending on each luminescence color only up to the pretreatment process in Manufacturing Example 1.

As a result, in FIG. 3c, it is possible to confirm a ligand ratio optimized through photoluminescence property analysis depending on a ligand ratio.

(d) In FIG. 3d, properties of the quantum do depending on a concentration of the ligand exchange solution were confirmed. In detail, a surface defect control property by ligand treatment may be confirmed through PL decay lifetime analysis of two kinds of surface passivated PeQDs in Manufacturing Example 1 and PeQDs in Manufacturing Comparative Example 1.

Evaluation Example 3 (Evaluation of Substrate Coating Property)

Thin films including PeQDs on which a final passivation layer was formed was formed on two substrates, respectively, by the same process as in Manufacturing Example 1. Specifically, two substrates were (substrate 1: material, thickness) and (substrate 2: material, thickness).

As a quantum dot, a $CsPbBr_3$ quantum dot was selected, and before coating each of the substrates after pretreating the quantum dot by the same process in Manufacturing Example 1, a partial ligand exchange reaction was carried out. Next, a thin film formed by a process of spin-coating a PeQDs solution in which ligands were partially exchanged on each substrate and removing the residual ligands was referred to as one layer (1 layer).

(1) Measurement of Thickness of Thin Film

While forming a thin film of 13 layers by repeated performing a thin film forming process on each substrate several times, total thicknesses of the thin film and the substrate were measured when the numbers of layers of the thin film were 3, 5, 7, 10, and 13, respectively.

The measurement results are shown in the following Table 1.

TABLE 1

|  | 3 layers | 5 layers | 7 layers | 10 layers | 13 layers |
| --- | --- | --- | --- | --- | --- |
| substrate 1 | 53 nm | 82 nm | 139 nm | 163 nm | 45 nm |
| substrate 2 | 55 nm | 85 nm | 135 nm | 174 nm | 142 nm |

Referring to Table 1, it may be confirmed that regardless of the kind and thickness of substrate, until the number of layers of the formed thin film was 10, the total thicknesses of the thin film and the substrate tended to constantly increased. Therefore, it may be confirmed that a thickness of each layer of the formed thin film was in a range of 12 to 30 nm.

However, when a thin film of more than 10 layers was formed, the total thickness of the thin film and the substrate started to decrease, such that there is a need to form the thin film within 10 layers.

Therefore, according to the exemplary embodiments of the present invention, it may be appreciated that a quantum dot of which a surface is passivated with a short chain ligand may be manufactured by performing a ligand exchange reaction on a substrate, and at the same time, a thin film including the quantum dot of which the surface is passivated as described above may be formed to have a desired thickness. This means that a quantum dot having excellent performance may be implemented by forming a quantum dot layer to have a desired thin film thickness within 10 layers on an arbitrary substrate.

(2) Fluorescence Microscopy Image

Meanwhile, after forming a thin film of 3 layers on an ITO substrate in the process in Evaluation Example 3, a fluorescence microscopy image thereof was captured, and shown in FIG. 4.

Referring to FIG. 4, it was confirmed that a green color by $CsPbBr_3$ quantum dot as the quantum dot was uniformly exhibited on a front surface.

Therefore, according to the exemplary embodiments of the present invention, it may be appreciated that a quantum dot of which a surface is passivated with a short chain ligand may be manufactured by performing a ligand exchange reaction on a substrate, and at the same time, a thin film including the quantum dot of which the surface is passivated as described above may be uniformly formed. This means that a high passivation ratio may be achieved by uniformly forming the quantum dot layer on an arbitrary substrate almost without a surface defect, and thus, a quantum dot light emitting diode having excellent performance may be implemented.

II. Evaluation of Performance of Organic Light Emitting Diode (OLED) to which PeQDs were Applied

Example 1

Actually, an ITO substrate was used as a cathode, and an electron transport layer containing ZnO was formed on the cathode. Specifically, after spin-coating a ZnO sol-gel solution (0.33 g of Zn(acetate) was dissolved in a solvent in which 3 mL of 2-methoxyethanol and 1 mL of isopropanol were mixed with each other) on the cathode at 3000 rpm, heat treatment was performed thereon at 250° C. for 15 minutes.

A polymer electrolyte layer was formed by spin-coating 2 mg/mL of a PFN solution (solvent: MeOH) on the electron transport layer formed as described above at 4000 rpm.

A quantum dot layer was formed on the polymer electrolyte layer using the method in Manufacturing Example 1.

Here, as a quantum dot, which is a surface passivation target, a $CsPbBr_3$ quantum dot (green), a $CsPbI_3$ quantum dot (red), or a $CsPbClBr_2$ quantum dot (blue) was selected, and each quantum dot was pretreated by the same process as in Manufacturing Example 1 and then, partially passivated.

The partially passivated quantum dot was spin-coated on the polymer electrolyte layer.

In addition, a concentration of a ligand exchange solution was variously set to 1.25 vol %, 2.5 vol %, and 5 vol %. A final ligand exchange reaction was carried out on the polymer electrolyte layer.

Thereafter, TAPC (60 nm), $MoO_3$ (10 nm), and Ag (100 nm) were sequentially deposited on the quantum dot layer using a thermal evaporator.

Finally, a quantum dot light emitting diode having an invert structure was obtained. Specifically, a structure thereof was ITO/ZnO(ETL)/PFN(polyelectrolyte)/PeQDs/TAPC(HTL)/$MoO_3$(HTL)/Ag.

Comparative Example 1

A quantum dot light emitting diode having an invert structure in which a quantum dot subjected up to a process of forming a pretreatment layer instead of a final surface-passivated quantum dot was applied to a quantum dot layer was manufactured. The quantum dot layer was formed using a $CsPbBr_3$ quantum dot (green), a $CsPbI_3$ quantum dot (red), or a $CsPbClBr_2$ quantum dot (blue) subjected up to the process of forming the pretreatment layer while performing other process equally to those in Example 1.

Evaluation Example 4 (Green)

FIG. 5a to FIG. 5d illustrate results obtained by driving respective quantum dot light emitting diodes in Example 1 and Comparative Example 1 in which the $CsPbBr_3$ quantum dot (green) was used.

(1) Specifically, FIG. 5a is a result obtained by driving each quantum dot light emitting diode depending on a concentration of a ligand solution used in SLE, and it may be confirmed that in the case of a ligand solution having a concentration of 2.5 vol %, optimal luminance was exhibited.

(2) FIG. 5b is a result obtained by driving each quantum dot light emitting diode depending on a concentration of a ligand solution used in SLE and it may be confirmed that in the case of a ligand solution having a concentration of 2.5 vol %, optimal current efficiency was exhibited.

(3) FIG. 5c is a result obtained by driving each quantum dot light emitting diode depending on a concentration of a ligand solution used in SLE, and it may be confirmed that under the condition of a ligand solution having a concentration of 2.5 vol %, a carrier leakage may be minimized.

(4) FIG. 5d is a result obtained by driving each quantum dot light emitting diode depending on a concentration of a ligand solution used in SLE, and it may be confirmed that in the case of a ligand solution having a concentration of 2.5 vol %, optimal current efficiency and luminance were exhibited.

Evaluation Example 5 (Red)

FIG. 6a to FIG. 6d illustrate results obtained by driving respective quantum dot light emitting diodes in Example 1 and Comparative Example 1 in which the $CsPbI_3$ quantum dot (red) was used.

(1) Specifically, FIG. 6a is a result obtained by driving each quantum dot light emitting diode depending on a concentration of a ligand solution used in SLE, and it may be confirmed that in the case of a ligand solution having a concentration of 2.3 vol %, optimal luminance was exhibited.

(2) FIG. 6b is a result obtained by driving each quantum dot light emitting diode depending on a concentration of a ligand solution used in SLE and it may be confirmed that in the case of a ligand solution having a concentration of 1.6 vol %, optimal current efficiency was exhibited.

(3) FIG. 6c is a result obtained by driving each quantum dot light emitting diode depending on a concentration of a ligand solution used in SLE, and it may be confirmed that under the condition of a ligand solution having a concentration of 1.6 vol %, a carrier leakage may be minimized.

(4) FIG. 6d is a result obtained by driving each quantum dot light emitting diode depending on a concentration of a ligand solution used in SLE, and it may be confirmed that in the case of a ligand solution having a concentration of 1.6 vol %, optimal current efficiency and luminance were exhibited.

Example 6 (Blue)

FIG. 7a to FIG. 7d illustrate results obtained by driving respective quantum dot light emitting diodes in Example 1 and Comparative Example 1 in which the $CsPbClBr_3$ quantum dot (blue) was used.

(1) Specifically, FIG. 7a is a result obtained by driving each quantum dot light emitting diode depending on a concentration of a ligand solution used in SLE, and it may be confirmed that in the case of a ligand solution having a concentration of 3.1 vol %, optimal luminescence was exhibited.

(2) FIG. 7b is a result obtained by driving each quantum dot light emitting diode depending on a concentration of a ligand solution used in SLE and it may be confirmed that in the case of a ligand solution having a concentration of 2.3 vol %, optimal current efficiency was exhibited.

(3) FIG. 7c is a result obtained by driving each quantum dot light emitting diode depending on a concentration of a ligand solution used in SLE, and it may be confirmed that under the condition of a ligand solution having a concentration of 3.1 vol %, a carrier leakage may be minimized.

(4) FIG. 7d is a result obtained by driving each quantum dot light emitting diode depending on a concentration of a ligand solution used in SLE, and it may be confirmed that in the case of a ligand solution having a concentration of 2.3 vol %, optimal current efficiency and luminance were exhibited.

The present invention is not limited to the embodiments, but may be implemented in various forms, and those skilled in the art will appreciate that the present invention may be implemented in other detailed forms without departing from the spirit or essential feature of the present invention. Therefore, it is to be understood that the embodiments described hereinabove are illustrative rather than being restrictive in all aspects.

The invention claimed is:

1. A quantum dot light emitting diode (QLED) having an invert structure comprising:
   a cathode including a transparent electrode;
   an electron transport layer positioned on the cathode;
   a quantum dot layer positioned on the electron transport layer;
   a hole transport layer positioned on the quantum dot layer; and
   an anode positioned on the hole transport layer,
   wherein the quantum dot layer includes,
   a surface-passivated quantum dot,
   the surface-passivated quantum dot including:
   a perovskite quantum dot (PeQD) including a compound having a perovskite structure represented by the following Chemical Formula 1; and
   a surface treatment layer positioned on a surface of the quantum dot and including an organic ligand represented by the following Chemical Formula 2 and an organic ligand represented by the following Chemical Formula 3, $ABX^1_3$  [Chemical Formula 1]

in Chemical Formula 1,
   A is one of $CH_3NH_2$, , Cs, Rb, Ba, In, K, and Tl,
   B is one element of Pb, Sn, Bi, Ag, Ge, and Zr,
   $X^1$ is one element of F, Cl, Br, and I, and
   a moiety indicated by * in $NH_2CH=NH_1$—* is bound to B,

[Chemical Formula 2]

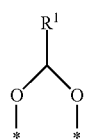

in Chemical Formula 2,
   $R^1$ is a substituted or unsubstituted (C6-C20) aryl group or substituted or unsubstituted (C1-C6) alkyl group, and moieties indicated by * are each bound to the surface of the quantum dot,

[Chemical Formula 3]

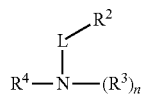

in Chemical Formula 3,
   L is one of (C1-C5) alkylene groups,
   $R^2$ to $R^4$ are each one of hydrogen, deuterium, tritium, a substituted or unsubstituted (C1-C6) alkyl group, and a substituted or unsubstituted (C6-C20) aryl group, and
   n is 0 or 1.

2. The quantum dot light emitting diode of claim 1, wherein:
   the quantum dot layer,
   has a total thickness of 1 to 300 nm.

3. The quantum dot light emitting diode of claim 2, wherein:
   the quantum dot layer,
   includes a thin film of 1 to 10 layers.

4. The quantum dot light emitting diode of claim 3, wherein:
   the thin film of one layer,
   has a thickness of 1 to 30 nm.

5. The quantum dot light emitting diode of claim 1, wherein:
   the surface-passivated quantum dot,
   is uniformly distributed in a front surface of the quantum dot layer.

6. The quantum dot light emitting diode of claim 5, wherein:
   the surface-passivated quantum dot,
   is distributed in a ratio of 80 sq % or more based on 100 sq % of the front surface of the quantum dot layer.

7. The quantum dot light emitting diode of claim 6, wherein:
   in the quantum dot layer,
   the surface-passivated quantum dot is distributed in a ratio of 80 to 100 vol % based on a total volume (100 vol %) of the quantum dot layer.

8. The quantum dot light emitting diode of claim 1, wherein:
   the electron transport layer,
   is a thin film containing at least one of metal oxide, bathocuproine (BCP), bathophenanthroline (Bphene), 3-(biphenyl-4-yl)-5-(4-tert-butylphenyl)-4-phenyl-4H-1,2,4-triazole (TAZ), tris(8-hydroxyquinolinato)aluminum (Alq3), 1,3,5-tris(2-N-phenylbenzimidazolyl)benzene (TPBi), and 1,3,5-triazine (T2T).

9. The quantum dot light emitting diode of claim 1, wherein:
   the hole transport layer,
   is a thin film containing at least one of N,N'-di(1-naphthyl)-N,N'-diphenyl-(1,1'-biphenyl)-4,4"-diamine (a-NPD), N,N'-di(1-naphthyl)-N,N'-diphenyl-(1,1'-biphenyl)-4,4"-diamine (NPB), 4,4'-cyclohexylidenebis[N,N-bis(4-methylphenyl)benzenamine] (TAPC), 1,4,5,8,9,11-hexaazatriphenylene hexacarbonitrile (HAT-CN), PEDOT:PSS, 4,4'-bis(N-carbazolyl)-1,1'-biphenyl (CBP), amorphous 4,4'-bis(N-carbazolyl)-1,1'-biphenyl (mCBP), 2,2',7,7'-tetrakis [N,N-di(4-methoxyphenyl)amino]-9,9'-spirobifluorene (Spiro-OMeTAD), and poly(9-vinylcarbazole) (PVK).

10. The quantum dot light emitting diode of claim 1, wherein:
    the passivation layer
    is formed by a solid-state ligand exchange (SLE) reaction.

11. The quantum dot light emitting diode of claim 10, wherein:
    the solid-state ligand exchange reaction
    is carried out on the electron transport layer.

12. The quantum dot light emitting diode of claim 1, further comprising a polymer electrolyte layer positioned between the electron transport layer and the quantum dot layer.

13. The quantum dot light emitting diode of claim 10, further comprising:
a polymer electrolyte layer positioned between the electron transport layer and the quantum dot layer, and
the solid-state ligand exchange reaction is carried out on the polymer electrolyte layer.

14. The quantum dot light emitting diode of claim 12, wherein:
the polymer electrolyte layer,
is made of one or two or more polymer electrolytes of poly[(9,9-bis(30-(N,N-dimethylamino)propyl)-2,7-fluorene)-alt-2,7-(9,9-dioctylfluorene)] (PFN), polyethylene imine (PEI), polyethyleneimine ethoxylated (PEIE).

15. The quantum dot light emitting diode of claim 1, wherein:
the cathode,
includes a transparent electrode made of ITO, FTO, an Ag nano-wire, a Cu nano-wire, or a combination thereof.

16. The quantum dot light emitting diode of claim 1, wherein:
the anode,
is made of Al, Ag, Au, or a combination thereof.

17. A method of manufacturing a quantum dot light emitting diode (QLED) having an invert structure, the method comprising:
preparing a cathode including a transparent electrode;
forming an electron transport layer on the cathode;
forming a quantum dot layer on the electron transport layer;
forming a hole transport layer on the quantum dot layer; and
forming an anode on the hole transport layer,
wherein the forming of the quantum dot layer on the electron transport layer includes: manufacturing a surface-passivated quantum dot; and applying and coating a solution containing the surface-passivated quantum dot on the electron transport layer,
the manufacturing of the surface-passivated quantum dot including: mixing a ligand exchange solution containing an organic ligand represented by $R^1$—COOH, an organic ligand represented by the following Chemical Formula 3, and a second organic solvent with a pretreated quantum dot to induce a ligand exchange reaction on a surface of the quantum dot,
in the pretreating of the surface of the quantum dot, a pretreatment layer containing a fatty acid based organic ligand and a fatty amine based organic ligand is formed on the surface of the quantum dot, and
in the inducing of the ligand exchange reaction on the surface of the quantum dot, the pretreatment layer is removed from the surface of the quantum dot, and at the same time, a final passivation layer containing an organic ligand represented by the following Chemical Formula 2 and the organic ligand represented by the following Chemical Formula 3 is formed:

$$ABX^1_3 \qquad \text{[Chemical Formula 1]}$$

in Chemical Formula 1,
A is one of $CH_3NH_2$, $NH_2CH=NH_1$—*, Cs, Rb, Ba, In, K, and Tl,
B is one element of Pb, Sn, Bi, Ag, Ge, and Zr,
$X^1$ is one element of F, Cl, Br, and I, and a moiety indicated by * in $NH_2CH=NH_1$—* is bound to B,

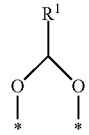

[Chemical Formula 2]

in Chemical Formula 2,
$R^1$ is a substituted or unsubstituted (C6-C20) aryl group or substituted or unsubstituted (C1-C6) alkyl group, and
moieties indicated by * are each bound to the surface of the quantum dot,

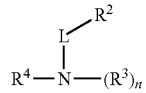

[Chemical Formula 3]

in Chemical Formula 3,
L is one of (C1-C5) alkylene groups,
$R^2$ to $R^4$ are each one of hydrogen, deuterium, tritium, a substituted or unsubstituted (C1-C6) alkyl group, and a substituted or unsubstituted (C6-C20) aryl group, and
n is 0 or 1.

18. A method of manufacturing a quantum dot light emitting diode (QLED) having an invert structure, the method comprising:
preparing a cathode including a transparent electrode;
forming an electron transport layer on the cathode;
forming a polymer electrolyte layer on the electron transport layer;
forming a quantum dot layer on the polymer electrolyte layer;
forming a hole transport layer on the quantum dot layer; and
forming an anode on the hole transport layer,
wherein the forming of the quantum dot layer on the polymer electrolyte layer includes: manufacturing a surface-passivated quantum dot; and applying and coating a solution containing the surface-passivated quantum dot on the polymer electrolyte layer,
the manufacturing of the surface-passivated quantum dot including: mixing a ligand exchange solution containing an organic ligand represented by $R^1$—COOH, an organic ligand represented by the following Chemical Formula 3, and a second organic solvent with a pretreated quantum dot to induce a ligand exchange reaction on a surface of the quantum dot,
in the pretreating of the surface of the quantum dot, a pretreatment layer containing a fatty acid based organic ligand and a fatty amine based organic ligand is formed on the surface of the quantum dot, and
in the inducing of the ligand exchange reaction on the surface of the quantum dot, the pretreatment layer is removed from the surface of the quantum dot, and at the same time, a final passivation layer containing an organic ligand represented by the following Chemical Formula 2 and the organic ligand represented by the following Chemical Formula 3 is formed:

$$ABX^1_3 \qquad \text{[Chemical Formula 1]}$$

in Chemical Formula 1,
A is one of $CH_3NH_2$, $NH_2CH=NH_1$—*, Cs, Rb, Ba, In, K, and Tl, B is one element of Pb, Sn, Bi, Ag, Ge, and Zr,
X$^1$ is one element of F, Cl, Br, and I, and
a moiety indicated by * in NH$_2$CH=NH$_1$—* is bound to B,

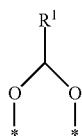
[Chemical Formula 2]

in Chemical Formula 2,
R$^1$ is a substituted or unsubstituted (C6-C20) aryl group or substituted or unsubstituted (C1-C6) alkyl group, and
moieties indicated by * are each bound to the surface of the quantum dot,

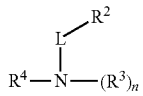
[Chemical Formula 3]

in Chemical Formula 3,
L is one of (C1-C5) alkylene groups,
R$^2$ to R$^4$ are each one of hydrogen, deuterium, tritium, a substituted or unsubstituted (C1-C6) alkyl group, and a substituted or unsubstituted (C6-C20) aryl group, and
n is 0 or 1.

19. A method of manufacturing a quantum dot light emitting diode, the method comprising:
preparing a cathode including a transparent electrode;
forming an electron transport layer on the cathode;
forming a quantum dot layer on the electron transport layer;
forming a hole transport layer on the quantum dot layer; and
forming an anode on the hole transport layer,
wherein the forming of the quantum dot layer on the electron transport layer includes:
mixing a pretreatment solution containing a fatty acid based organic ligand, a fatty amine based organic ligand, and a first organic solvent with a perovskite quantum dot (PeQD) containing a compound having a perovskite structure represented by the following Chemical Formula 1 to pretreat a surface of the quantum dot;
coating the pretreated quantum dot on the electron transport layer; and
applying a ligand exchange solution containing an organic ligand represented by R$^1$—COOH, an organic ligand represented by the following Chemical Formula 3, and a second organic solvent on the electron transport layer to induce a ligand exchange reaction on the surface of the quantum dot coated on the electron transport layer,
in the pretreating of the surface of the quantum dot, a pretreatment layer containing a fatty acid based organic ligand and a fatty amine based organic ligand is formed on the surface of the quantum dot, and
in the inducing of the ligand exchange reaction on the surface of the quantum dot coated on the electron transport layer, the pretreatment layer is removed from the surface of the quantum dot coated on the electron transport layer, and at the same time, a final passivation layer containing an organic ligand represented by the following Chemical Formula 2 and the organic ligand represented by the following Chemical Formula 3 is formed:

ABX$^1_3$ [Chemical Formula 1]

in Chemical Formula 1,
A is one of CH$_3$NH$_2$, NH$_2$CH=NH$_1$—*, Cs, Rb, Ba, In, K, and Tl,
B is one element of Pb, Sn, Bi, Ag, Ge, and Zr,
X$^1$ is one element of F, Cl, Br, and I, and
a moiety indicated by * in NH$_2$CH=NH$_1$—* is bound to B,

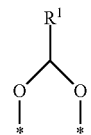
[Chemical Formula 2]

in Chemical Formula 2,
R$^1$ is a substituted or unsubstituted (C6-C20) aryl group or substituted or unsubstituted (C1-C6) alkyl group, and
moieties indicated by * are each bound to the surface of the quantum dot,

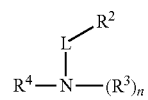
[Chemical Formula 3]

in Chemical Formula 3,
L is one of (C1-C5) alkylene groups,
R$^2$ to R$^4$ are each one of hydrogen, deuterium, tritium, a substituted or unsubstituted (C1-C6) alkyl group, and a substituted or unsubstituted (C6-C20) aryl group, and
n is 0 or 1.

* * * * *